United States Patent
Jang et al.

(10) Patent No.: US 11,249,588 B2
(45) Date of Patent: *Feb. 15, 2022

(54) DISPLAY APPARATUS

(71) Applicant: Samsung Display Co., Ltd., Yongin-Si (KR)

(72) Inventors: Hyoungwook Jang, Sejong (KR); Gwang-bum Ko, Suwon-si (KR); Hyunjae Na, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/885,559

(22) Filed: May 28, 2020

(65) Prior Publication Data

US 2020/0293141 A1 Sep. 17, 2020

Related U.S. Application Data

(62) Division of application No. 15/409,931, filed on Jan. 19, 2017, now Pat. No. 10,698,523.

(30) Foreign Application Priority Data

Jun. 16, 2016 (KR) .................. 10-2016-0075308

(51) Int. Cl.
*G06F 3/044* (2006.01)
*G06F 3/041* (2006.01)
*H01L 27/32* (2006.01)

(52) U.S. Cl.
CPC ........ *G06F 3/04164* (2019.05); *G06F 3/0412* (2013.01); *G06F 3/0443* (2019.05);
(Continued)

(58) Field of Classification Search
CPC .. G06F 3/04164; G06F 3/0443; G06F 3/0412; G06F 2203/04102;
(Continued)

(56) References Cited

U.S. PATENT DOCUMENTS 7,459,753 B2 12/2008 Horiguchi et al.
9,184,409 B2 11/2015 Choi et al.
(Continued)

FOREIGN PATENT DOCUMENTS

JP 2008015226 A 1/2008
JP 2014039003 A 2/2014
(Continued)

*Primary Examiner* — Lunyi Lao
*Assistant Examiner* — Jarurat Suteerawongsa
(74) *Attorney, Agent, or Firm* — Cantor Colburn LLP

(57) ABSTRACT

A display apparatus includes an organic light emitting display panel including a circuit layer and a touch sensing unit disposed on the organic light emitting display panel and including sensor blocks and touch signal lines connected to the sensor blocks. The circuit layer includes first signal lines disposed on a base layer, a first insulation layer disposed on the first signal lines, second signal lines disposed on the first insulation layer, and dummy conductive patterns. Each of the touch signal lines includes a touch line part and a touch pad part connected to an end of the touch line part. The dummy conductive patterns include a dummy conductive pad disposed directly on a same layer as the first signal lines or the second signal lines and overlap the touch pad part.

10 Claims, 23 Drawing Sheets

(52) U.S. Cl.
CPC ........ *H01L 27/323* (2013.01); *H01L 27/3262* (2013.01); *H01L 27/3276* (2013.01); *G06F 2203/04102* (2013.01); *G06F 2203/04112* (2013.01)

(58) Field of Classification Search
CPC ......... G06F 2203/04112; G06F 3/0416; G06F 3/044; H01L 27/323; H01L 27/3262; H01L 27/3276
See application file for complete search history.

(56) References Cited

U.S. PATENT DOCUMENTS

| | | | | |
|---|---|---|---|---|
| 10,698,523 | B2 * | 6/2020 | Jang | G06F 3/04164 |
| 2010/0013745 | A1 * | 1/2010 | Kim | H01L 27/3244 |
| | | | | 345/76 |
| 2011/0073864 | A1 | 3/2011 | Liu et al. | |
| 2011/0291977 | A1 * | 12/2011 | Moriwaki | G02F 1/136286 |
| | | | | 345/173 |
| 2013/0181942 | A1 * | 7/2013 | Bulea | G06F 3/0443 |
| | | | | 345/174 |
| 2014/0078077 | A1 * | 3/2014 | Choi | G06F 3/04164 |
| | | | | 345/173 |
| 2015/0185942 | A1 * | 7/2015 | Kim | G06F 3/044 |
| | | | | 345/173 |
| 2015/0261348 | A1 * | 9/2015 | Jang | G06F 3/04164 |
| | | | | 345/174 |
| 2015/0364507 | A1 | 12/2015 | Won et al. | |
| 2016/0103537 | A1 | 4/2016 | Park et al. | |
| 2016/0224156 | A1 | 8/2016 | Ahn | |

FOREIGN PATENT DOCUMENTS

| | | |
|---|---|---|
| JP | 2014059539 A | 4/2014 |
| JP | 2015509245 A | 3/2015 |
| JP | 2015176602 A | 10/2015 |
| KR | 1020110127236 A | 11/2011 |
| KR | 1020120045291 A | 5/2012 |
| KR | 1020130124882 A | 11/2013 |
| KR | 101397200 B1 | 5/2014 |
| KR | 1020140062341 A | 5/2014 |
| KR | 101493556 B1 | 2/2015 |
| KR | 1020150077205 A | 7/2015 |
| KR | 1020150108003 A | 9/2015 |
| KR | 101633175 B1 | 6/2016 |
| WO | 2010084642 A1 | 7/2010 |

\* cited by examiner

DISPLAY APPARATUS

This application is a divisional of U.S. patent application Ser. No. 15/409,931, filed on Jan. 19, 2017, which claims priority to Korean Patent Application No. 10-2016-0075308, filed on Jun. 16, 2016, and all the benefits accruing therefrom under 35 U.S.C. § 119, the content of which in its entirety is herein incorporated by reference.

BACKGROUND

1. Field

The disclosure herein relates to a display apparatus, and more particularly, to a display apparatus with an integrated touch sensing unit.

2. Description of the Related Art

Various display apparatuses widely used in multimedia devices such as televisions, mobile phones, table computers, navigation devices, and game consoles are being developed. Such a display apparatus typically includes an input unit such as keyboard or a mouse, for example. Recently, the display apparatus may include a touch panel as the input unit.

SUMMARY

The disclosure is directed to a display apparatus having a simplified structure and improved flexibility.

According to an embodiment of the inventive concept, a display apparatus includes an organic light emitting display panel and a touch sensing unit. In such an embodiment, the organic light emitting display panel includes a base layer, a circuit layer disposed on the base layer, a light emitting element layer disposed on the circuit layer, and a thin film encapsulation layer disposed on the light emitting element layer. In such an embodiment, the touch sensing unit includes: sensor blocks disposed on the thin film encapsulation layer and arranged substantially in a matrix form including sensor columns and sensor rows; and touch signal lines connected to the sensor blocks. In such an embodiment, each of the sensor blocks includes: a first sensor; and i second sensors arranged in a sensor column direction, where i is a natural number equal to or greater than 2, and the touch signal lines includes: first touch signal lines connected to first sensors of the sensor blocks, respectively; second touch signal lines, a second touch signal line of which is connected to a j-th second sensor of the i second sensors of a sensor block among the sensor blocks in a sensor column and an (i−j+1)-th second sensor of the i second sensors of a next sensor block among the sensor blocks in the sensor column, wherein j is a natural number equal to or greater than 1 and equal to or less than i; and a third touch signal line connected to two second touch signal lines respectively connected to j-th second sensors of two sensor blocks in a same sensor row, or connected to two first touch signal lines respectively connected to the first sensors of the two sensor blocks in the same sensor row. In such an embodiment, the circuit layer includes: first signal lines disposed on the base layer: a first insulation layer disposed on the first signal lines; second signal lines disposed on the first insulation layer; and a dummy conductive line disposed on the first signal lines or the first insulation layer. In such an embodiment, a touch signal line, among the first and second touch signal lines, is not connected to the third touch signal line, and one of the touch signal line and the third touch signal line is connected to the dummy conductive line.

In an embodiment, the dummy conductive line is disposed directly on a same layer as the first signal lines or the second signal lines, and the touch signal line, which is not connected to the third touch signal line, is disposed directly on a same layer as the third touch signal line, In an embodiment, the third touch signal line may be connected to the two second touch signal lines, each of the two first touch signal lines may be the touch signal line, which is not connected to the third touch signal line, the two first touch signal lines may be connected to the dummy conductive line, and the third touch signal line may overlap the dummy conductive line.

In an embodiment, each of the one first touch signal line and the other first touch signal line may include a touch line part and a touch pad part connected to an end of the touch line part. In such an embodiment, the touch line part may include: a first line part having a first end connected to a corresponding first sensor of the first sensors of the two sensor blocks and a second end connected to the dummy conductive line; and a second line part having a first end connected to the dummy conductive line and a second end connected to the touch pad part.

In an embodiment, the dummy conductive line may be disposed directly on a same layer as the first signal lines, and the first line part may be connected to the dummy conductive line through a first contact hole defined through the first insulation layer.

In an embodiment, the third touch signal line may be connected to the two second touch signal lines, each of the two first touch signal lines may be the touch signal line which is not connected to the third touch signal line, the third touch signal line may be connected to the dummy conductive line, and the two first touch signal lines may overlap the dummy conductive line.

In an embodiment, the third touch signal line may include: a first line part having a first end connected to the dummy conductive line; and a second line part having a first end connected to the dummy conductive line and spaced apart from the first line part in a sensor row direction.

In an embodiment, the third touch signal line may be connected to the two first touch signal lines, each of the two second touch signal lines may be the touch signal line which is not connected to the third touch signal line, the two second touch signal lines may be connected to the dummy conductive line, and the third touch signal line may overlap the dummy conductive line.

In an embodiment, each of the two second touch signal lines may include a touch line part and a touch pad part connected to an end of the touch line part. In such an embodiment, the touch line part may include: a first line part having a first end connected to a corresponding j-th second sensor and a second end connected to the dummy conductive line; and a second line part having a first end connected to the dummy conductive line and a second end connected to the touch pad part.

In an embodiment, the third touch signal line may be connected to the two first touch signal lines, each of the two second touch signal lines may be the touch signal line which is not connected to the third touch signal line, the third touch signal line may be connected to the dummy conductive line, and the two second touch signal lines may overlap the dummy conductive line.

In an embodiment, the third touch signal line may include: a first line part having an end connected to the dummy conductive line; and a second line part having an end connected to the dummy conductive line and spaced apart from the first line part in a sensor row direction.

According to another embodiment of the inventive concept, a display apparatus includes: an organic light emitting display panel including a base layer, a circuit layer disposed on the base layer, a light emitting element layer disposed on the circuit layer, and a thin film encapsulation layer disposed on the light emitting element layer; and a touch sensing unit disposed on the thin film encapsulation layer and including a touch sensor and touch signal lines connected to the touch sensor. In such an embodiment, the circuit layer may include first signal lines disposed on the base layer, a first insulation layer disposed on the first signal lines, second signal lines disposed on the first insulation layer, and a dummy conductive pad. In such an embodiment, each of the touch signal lines includes a touch line part and a touch pad part connected to an end of the touch line part, and the dummy conductive pad is disposed on directly on a same layer as the first signal lines or the second signal lines, and overlaps the touch pad part.

In an embodiment, the dummy conductive pad may include a first dummy conductive pad disposed directly on a same layer as the first signal lines and a second dummy conductive pad disposed directly on a same layer as the second signal lines.

In an embodiment, the touch pad part may be connected to the first dummy conductive pad through a first contact hole defined through at least the first insulation layer.

In an embodiment, the circuit layer may further include a second insulation layer disposed on the second signal lines, and the touch pad part may be connected to the second dummy conductive pad through a second contact hole defined through the second insulation layer.

In an embodiment, each of the first dummy conductive pad and the second dummy conductive pad may include a floating electrode.

In an embodiment, each of the second signal lines may include a signal line part and a signal pad part connected to an end of the signal line part, and the touch sensing unit may further include a floating electrode disposed directly on a same layer as the touch pad part and connected to the signal pad part.

In an embodiment, the display apparatus may further include a resin layer disposed to cover an exposed portion of each of the touch signal lines through the optical member.

In an embodiment, the display apparatus may further include an optical member overlapping the touch sensing unit.

In an embodiment, the touch sensor and the touch signal lines may be directly disposed on the thin film encapsulation layer.

In an embodiment, the light emitting element layer may include emission areas and a non-emission area surrounding the light emission areas, and a shape of the touch signal lines may include a mesh shape, which overlaps the non-emission area and exposes the emission areas.

In an embodiment, the touch sensor may include sensor blocks arranged substantially in a matrix form including sensor columns and sensor rows, each of the sensor blocks may include sensors connected to the touch signal lines, and a shape of the sensors may include a mesh shape, which overlaps the non-emission area and exposes the emission areas.

In an embodiment, the organic light emitting display panel may include a display area overlapping the thin film encapsulation layer and a non-display area which does not overlap the thin film encapsulation layer. In such an embodiment, the dummy conductive pad and the touch pad part may be disposed in the non-display area.

According to another embodiment of the inventive concept, a display apparatus includes: an organic light emitting display panel including a base layer, a circuit layer disposed on the base layer, a light emitting element layer disposed on the circuit layer, and a thin film encapsulation layer disposed on the light emitting element layer; and a touch sensing unit disposed on the thin film encapsulation layer and including a first touch sensor, a second touch sensor, and first and second touch signal lines disposed directly on a same layer as the first and second touch sensors and respectively connected to the first and second touch sensors. In such an embodiment, the circuit layer includes first signal lines disposed on the base layer, a second signal line crossing the first signal lines and insulated from the first signal lines, and a dummy conductive line disposed directly on a same layer as the first signal lines or the second signal lines. In such an embodiment, the first touch signal line includes a first line part having a first end connected to the first touch sensor and a second end connected to the dummy conductive line and a second line part having a first end connected to the dummy conductive line and a second end connected to a touch pad part. In such an embodiment, the second touch signal line crosses the dummy conductive line and insulated from the dummy conductive line.

According to another embodiment of the inventive concept, a display apparatus includes: an organic light emitting display panel including a base layer, a circuit layer disposed on the base layer, a light emitting element layer disposed on the circuit layer, and a thin film encapsulation layer disposed on the light emitting element layer; and a touch sensing unit including: sensor blocks disposed on the thin film encapsulation layer and arranged substantially in a matrix form including sensor columns and sensor rows; and touch signal lines connected to the sensor blocks. In such an embodiment, each of the sensor blocks includes: a first sensor extending in a direction; and i second sensors sequentially arranged along the first sensor and disposed directly on a same layer as the first sensor, where i is a natural number equal to or greater than 2. In such an embodiment, the touch signal lines includes: first touch signal lines connected to first sensor of the sensor blocks in a same sensor row, respectively, where a first touch signal line of the first touch signal lines is connected to the first sensor of a corresponding sensor block; second touch signal lines connected to j-th second sensors of the sensor blocks in the same sensor row, respectively, where j is a natural number equal to or greater than 1 and equal to or less than i; and a third touch signal line connected to the first touch signal lines and insulated from the second touch signal lines or connected to the second touch signal lines and insulted from the first touch signal lines. In such an embodiment, the circuit layer includes: first signal lines disposed on the base layer: a first insulation layer disposed on the first signal lines; second signal lines disposed on the first insulation layer; and a dummy conductive line disposed directly on a same layer as the first signal lines or the second signal lines. In such an embodiment, a touch signal line, among the first and second touch signal lines, is not connected to the third touch signal line and is disposed directly on a same layer as the third touch signal line, and one of the touch signal line, which is not connected to the third touch signal line, and the third touch signal line is connected to the dummy conductive line.

In an embodiment, the third touch signal line may be connected to the second touch signal lines, each of the first touch signal lines may be the touch signal line, which is not connected to the third touch signal line, and the other of the touch signal line, which is not connected to the third touch signal line, and the third touch signal line may overlap the dummy conductive line.

In an embodiment, the third touch signal line may be connected to the first touch signal lines, each of the second touch signal lines may be the touch signal line which is not connected to the third touch signal line, and the other of the touch signal line, which is not connected to the third touch signal line, and the third touch signal line may overlap the dummy conductive line.

In an embodiment, the touch signal lines may further include a fourth touch signal line connected to the third touch signal line, the circuit layer may include a dummy conductive pad disposed directly on a same layer as the first signal lines or the second signal lines. In such an embodiment, each of the touch signal line, which is not connected to the third touch signal line, and the fourth touch signal line may include a touch pad part at an end thereof, where the touch pad part may be connected to the dummy conductive pad through a contact hole defined through at least the first insulation layer.

In an embodiment, the dummy conductive pad may include: a first dummy conductive pad disposed directly on a same layer as the first signal lines; and a second dummy conductive pad disposed directly on a same layer as the second signal lines.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1A:
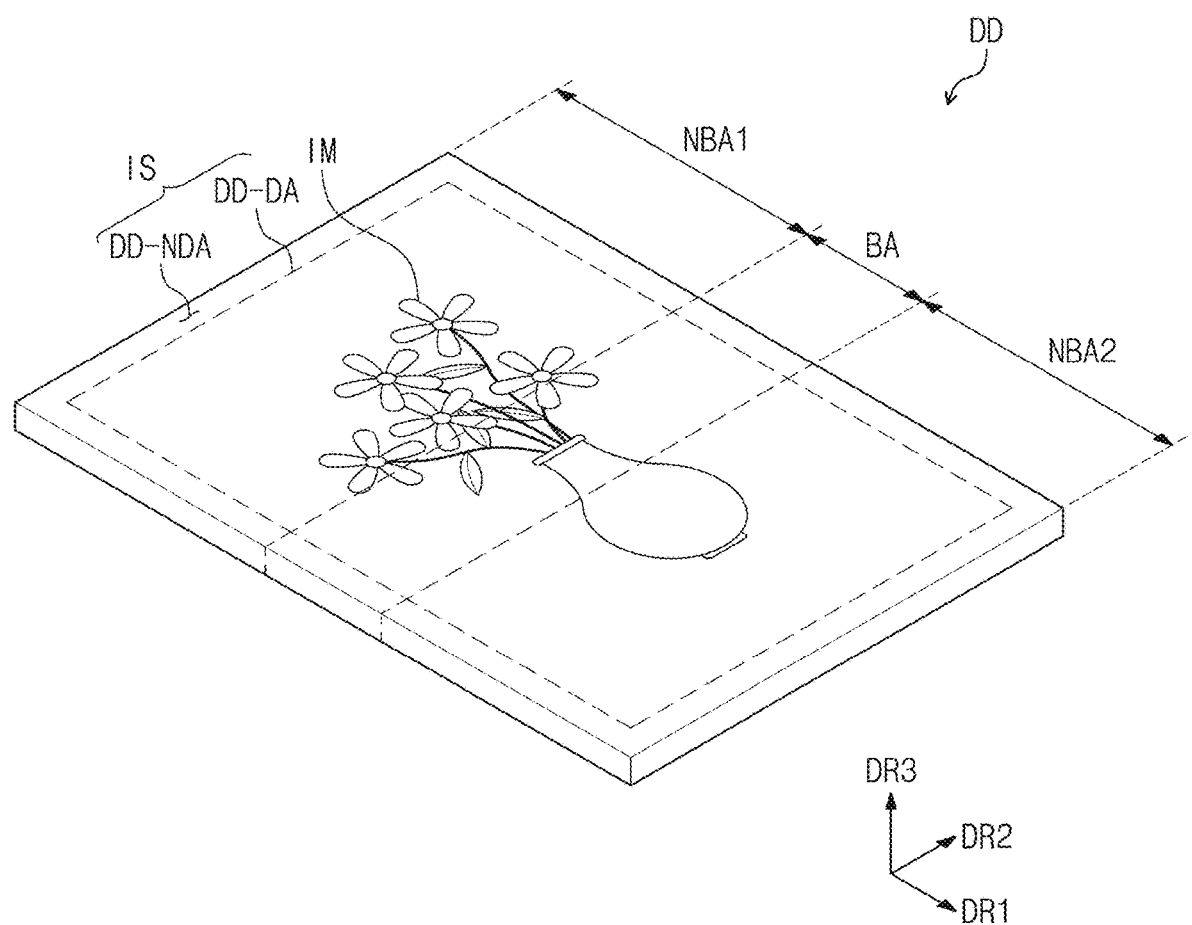
FIG. 1A is a perspective view illustrating a display apparatus in a first operation state according to an embodiment of the inventive concept.

Hereinafter, embodiments of the inventive concept will be described with reference to the accompanying drawings. In this specification, it will also be understood that when an element (or region, layer, portion) is referred to as being "on", "connected to", or "coupled to" another element, it can be directly disposed/connected/coupled on/to the other element, or an intervening element may also be present therebetween. In contrast, when an element is referred to as being "directly on," "directly connected to", or 'directly coupled to' another element, there is no intervening element present.

Like reference numerals refer to like elements throughout. Also, in the figures, the thickness, ratio, and dimensions of components are exaggerated for clarity of illustration. "Or" means "and/or." As used herein, the term "and/or" includes any and all combinations of one or more of the associated listed items.

It will be understood that although the terms "first," "second," "third" etc. are used herein to describe various elements, these elements should not be limited by these terms. These terms are only used to distinguish one element from other elements. Thus, "a first element," "component," "region," "layer" or "section" discussed below could be termed a second element, component, region, layer or section without departing from the teachings herein.

Spatially relative terms, such as "under," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular forms "a," "an," and "the" are intended to include the plural forms, including "at least one," unless the content clearly indicates otherwise. The meaning of 'include' or 'comprise' specifies a property, a fixed number, a step, an operation, an element, a component or a combination thereof, but does not preclude the presence or addition of one or more other properties, fixed numbers, steps, operations, elements, components or combinations thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the inventive concept will be described in detail with reference to the accompanying drawings.

Figure 1B:
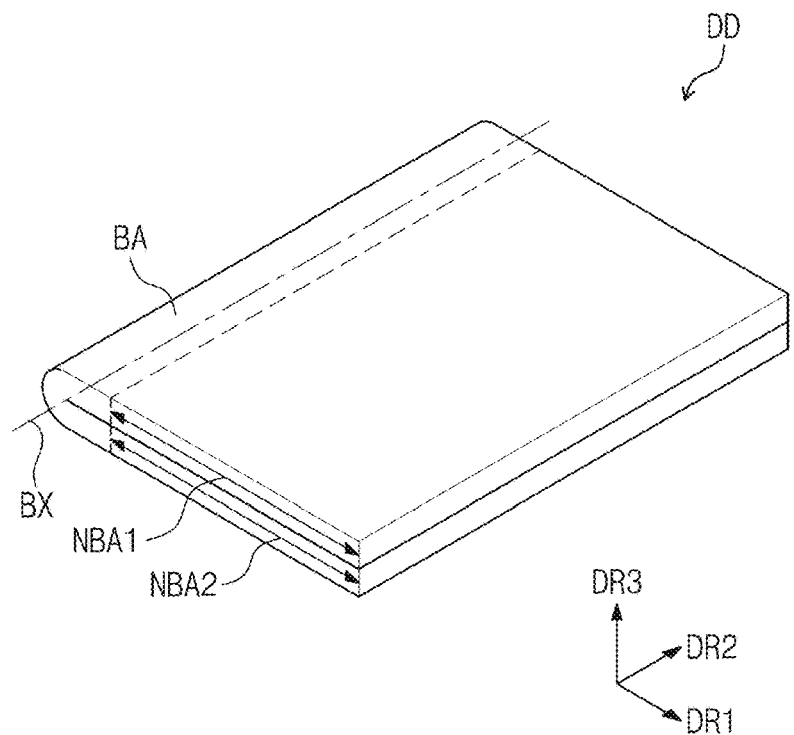
FIG. 1B is a perspective view illustrating the display apparatus in a second operation state according to an embodiment of the inventive concept.
Figure 1C:
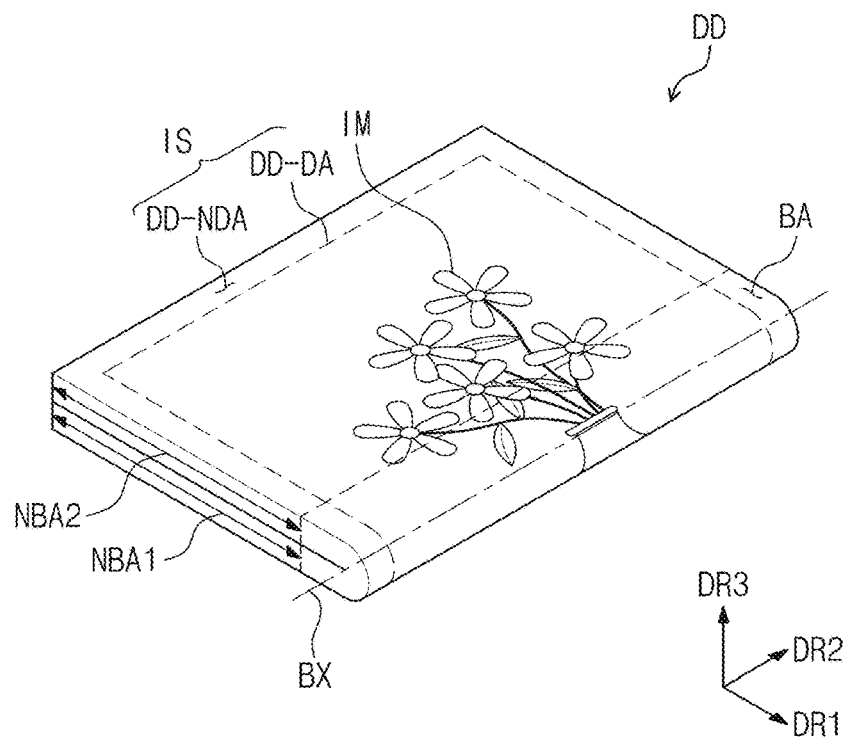
FIG. 1C is a perspective view illustrating the display apparatus in a third operation state according to an embodiment of the inventive concept.
Figure 1D:
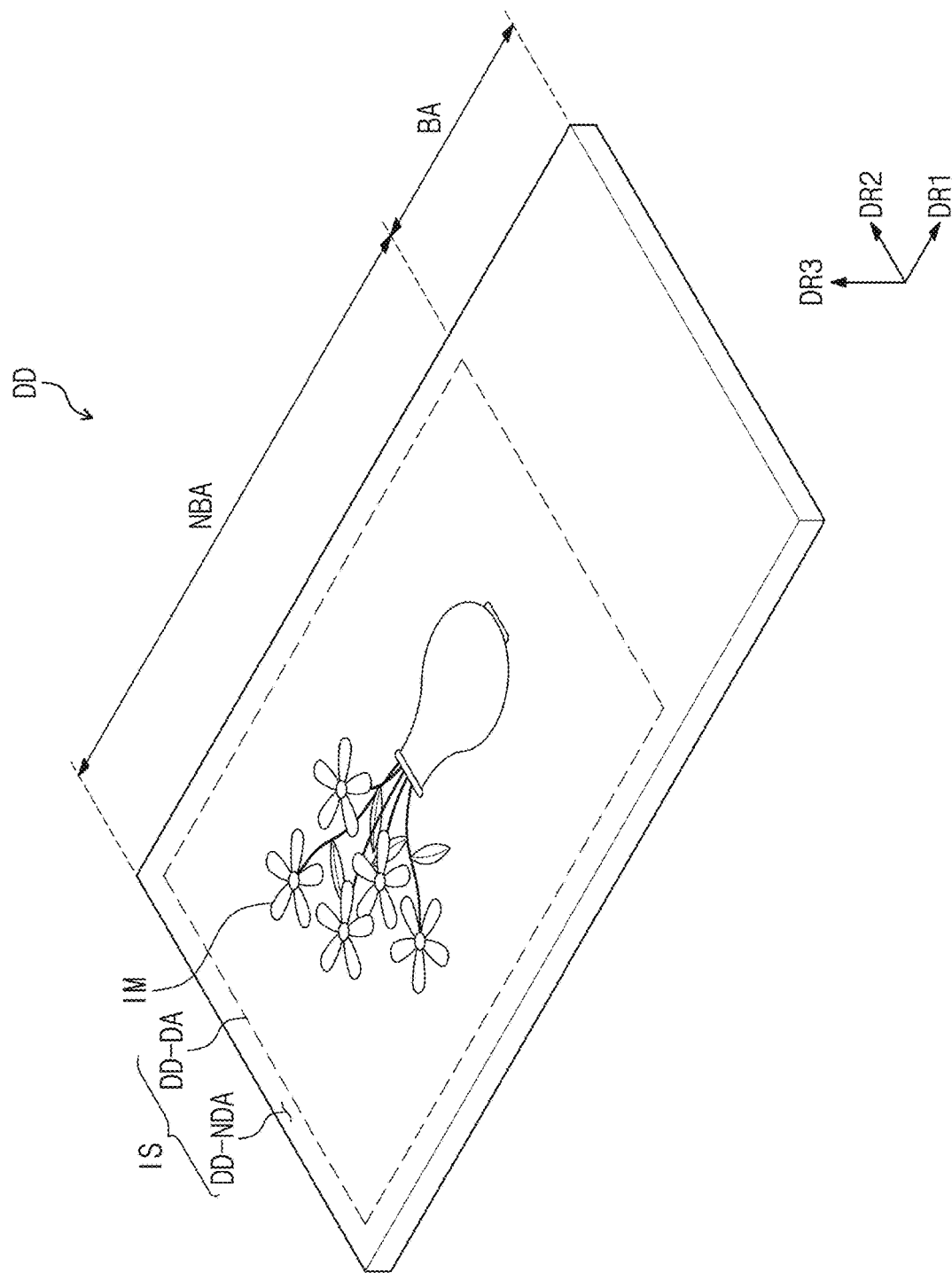
FIG. 1D is a perspective view illustrating a display apparatus in a first operation state according to an alternative embodiment of the inventive concept.
Figure 1E:
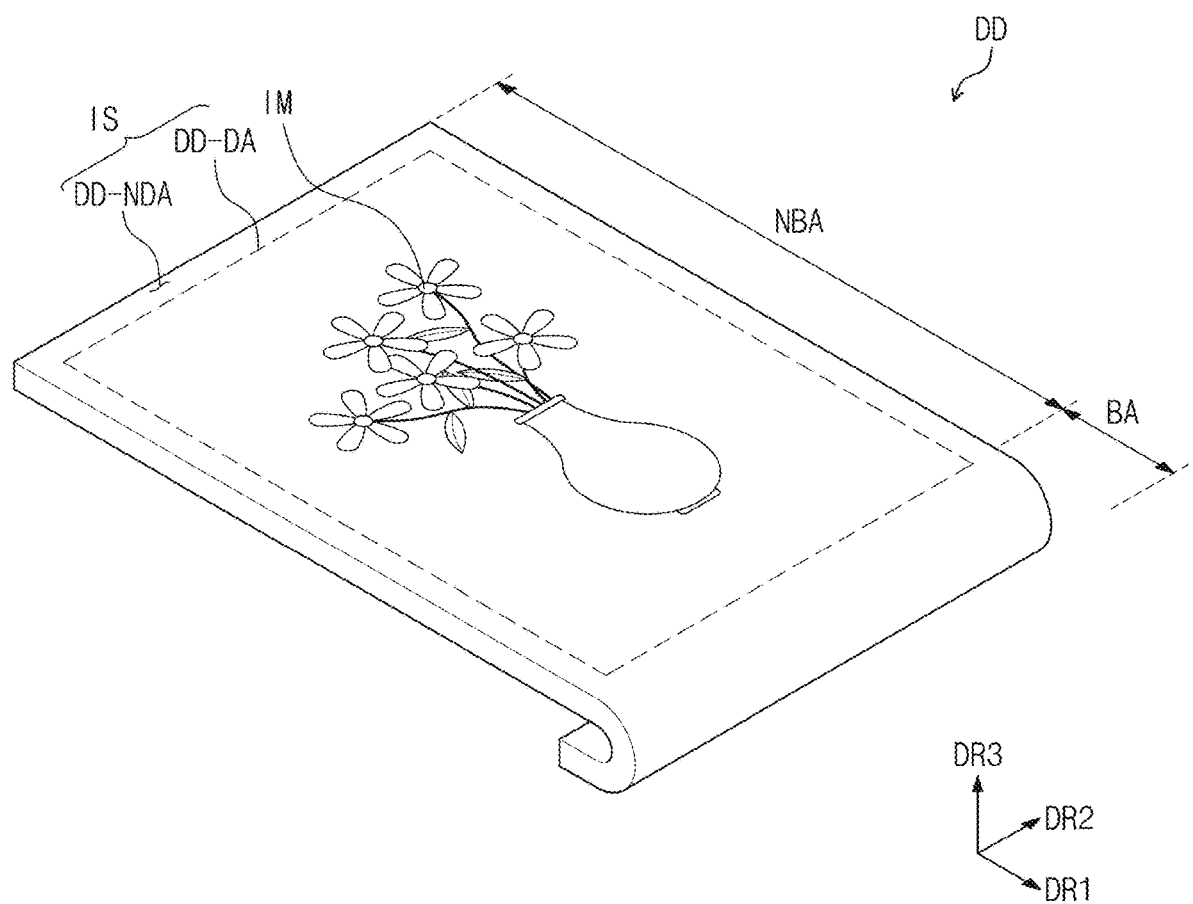
FIG. 1E is a perspective view illustrating the display apparatus in a second operation state according to an alternative embodiment of the inventive concept.

FIG. 1A is a perspective view illustrating a display apparatus DD in a first operation state according to an embodiment of the inventive concept. FIG. 1B is a perspective view illustrating the display apparatus DD in a second operation state according to an embodiment of the inventive concept. FIG. 1C is a perspective view illustrating the display apparatus DD in a third operation state according to an embodiment of the inventive concept. FIG. 1D is a perspective view illustrating a display apparatus in a first operation state according to an alternative embodiment of the inventive concept. FIG. 1E is a perspective view illustrating the display apparatus in a second operation state according to an alternative embodiment of the inventive concept.

As illustrated in FIG. 1A, in a first operation mode or state, a display surface IS, on which an image IM is displayed, is parallel to a surface that is defined by a first directional axis DR1 and a second directional axis DR2. A normal direction of the display surface IS is indicated as a third directional axis DR3, e.g., a thickness direction of the display apparatus DD. A front surface (or top surface) and a rear surface (or bottom surface) of each of members is distinguished by the third directional axis DR3. However, directions indicated by the first to third directional axes DR1, DR2, and DR3 may be a relative concept and thus changed into different directions. Hereinafter, first to third directions may be directions indicated by the first to third directional axes DR1, DR2 and DR3, respectively, and designated by the same reference numerals, respectively. In an embodiment, as shown in FIGS. 1A to 1E, the display apparatus DD may be a flexible display, but the embodiment of the inventive concept is not limited thereto. Alternatively, the display apparatus DD may be a flat display apparatus.

FIGS. 1A to 1C illustrate an embodiment where the display apparatus DD is a foldable display apparatus. Alternatively, the display apparatus DD may be a rollable flexible display apparatus, but not being specifically limited. Such an embodiment of the flexible display apparatus DD may be used for large-sized electronic devices such as televisions and monitors or small and middle-sized electronic devices such as mobile phones, tablet PC, navigation units for vehicles, game consoles, and smart watches.

In an embodiment, as illustrated in FIG. 1A, the display surface IS of the flexible display apparatus DD may include a plurality of areas. The flexible display apparatus DD include a display area DD-DA on which the image IM is displayed and a non-display area DD-NDA that is adjacent to the display area DD-DA. The non-display area DD-NDA may be an area on which an image is not displayed. FIG. 1A illustrates a flower vase as an example of the image IM. In one embodiment, for example, the display area DD-DA may have a rectangular shape. The non-display area DD-NDA may surround the display area DD-DA. However, the embodiment of the inventive concept is not limited thereto. Alternatively, shapes of the display area DD-DA and the non-display area DD-NDA may be variously modified.

In an embodiment, as illustrated in FIGS. 1A to 1C, the display apparatus DD may include a plurality of areas defined according to an operation state or mode thereof. The display apparatus DD may include a bendable area BA that is bendable about a bending axis BX, a first non-bendable area NBA1 that is not bendable, and a second non-bendable area NBA2 that is not bendable. As illustrated in FIG. 1B, the display apparatus DD may be bent inward to allow the display surface IS of the first non-bendable area NBA1 and the display surface IS of the second non-bendable area NBA2 to face each other. As illustrated in FIG. 1C, the display apparatus DD may be bent outward to allow the display surface IS to be exposed to the outside.

In an embodiment of the inventive concept, the display apparatus DD may include a plurality of bent areas BD. In an embodiment, the bent areas BA may be defined to corresponding to user's operations for manipulating the display apparatus DD. In one alternative embodiment, for example, each of the bent areas DA may be defined in parallel to the first directional axis DR1 or defined in a diagonal direction, unlike the embodiment shown in FIGS. 1B and 1C. The bendable area BA may be determined according to a curvature radius thereof, rather than determined as a specific or predetermined area. In an embodiment of the inventive concept, the display apparatus DD may be only in the first and second operations states or have a shape in which only the operation states of FIGS. 1A and 1B is repeated.

FIGS. 1D and 1E illustrate an embodiment of a foldable display apparatus in which the bendable area BA is defined in the non-display area DD-NDA thereof. In such an embodiment of the display apparatus DD, as described above, the number of the bendable and non-bendable areas BA and NBA and a position of the bendable area BA are not limited to those shown in FIGS. 1D and 1E.

Figure 2A:
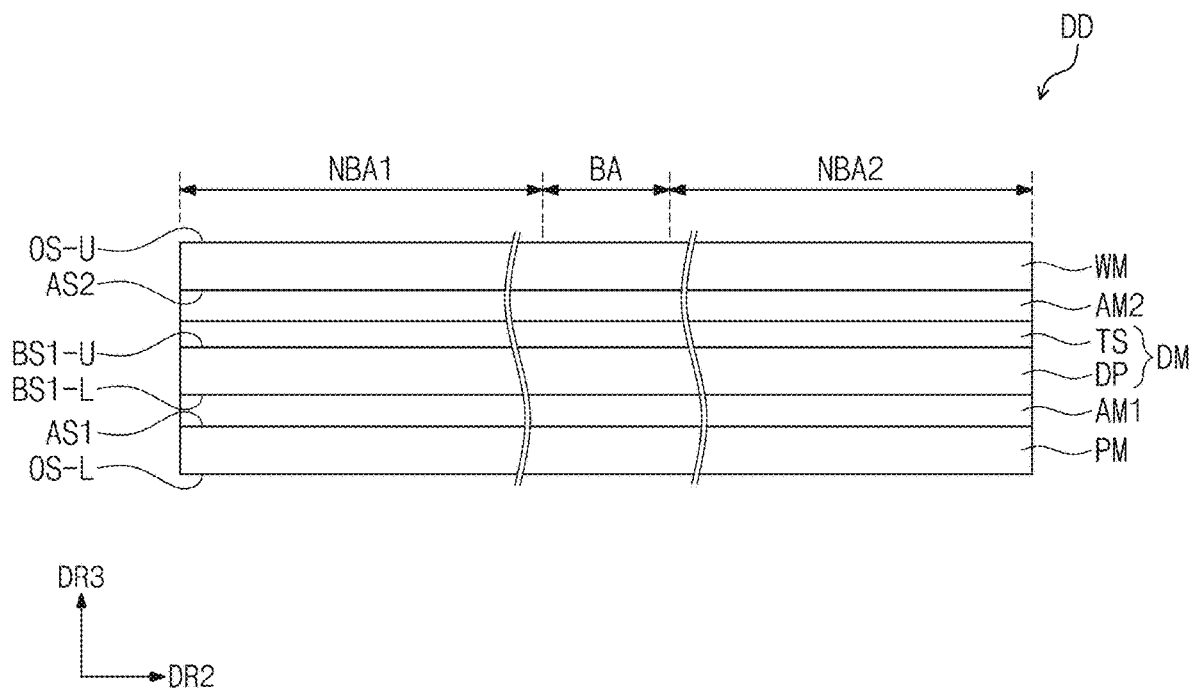
FIG. 2A is a cross-sectional view of the display apparatus according to an embodiment of the inventive concept.
Figure 2B:
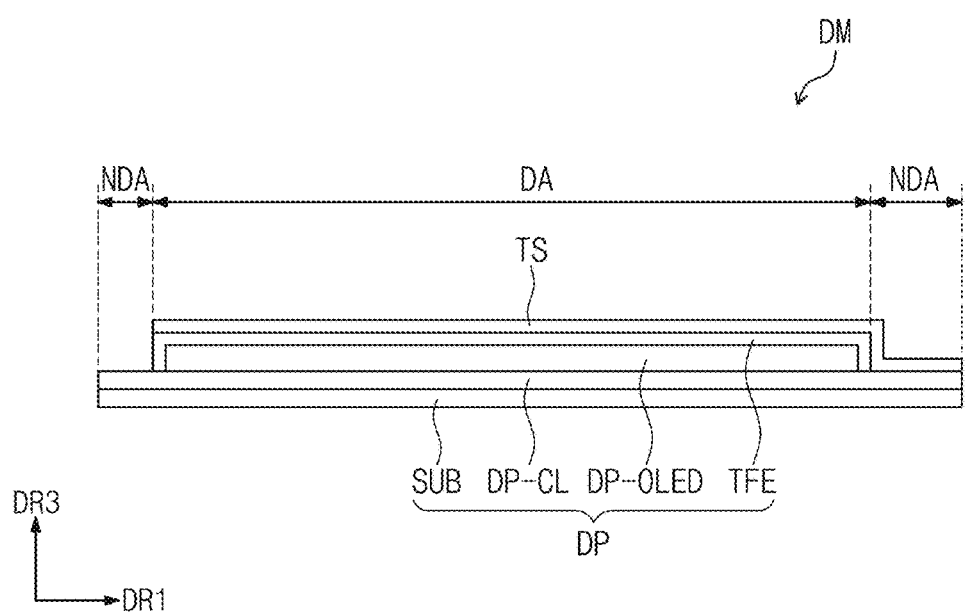
FIG. 2B is a cross-sectional view of a display module according to an embodiment of the inventive concept.

FIG. 2A is a cross-sectional view of the display apparatus DD according to an embodiment of the inventive concept. FIG. 2B is a cross-sectional view of a display module DM according to an embodiment of the inventive concept. FIG. 2A illustrates a cross-sectional view taken parallel to a plane defined by the second directional axis DR2 and the third directional axis DR3, and FIG. 2B illustrates a cross-sectional view taken parallel to a plane defined by the first directional axis DR1 and the third directional axis DR3.

As illustrated in FIG. 2A, the display apparatus DD includes a protection film PM, a window WM, a display module DM, a first adhesion member AM1, and a second adhesion member AM2. The display module DM is disposed between the protection film PM and the window WM. The first adhesion member AM1 is disposed between and coupled to the display module DM and the protection film PM, and the second adhesion member AM2 is disposed between and coupled to the display module DM and the window WM.

The protection film PM protects the display module DM. An outer surface of the protection film PM defines a first outer surface OS-L of the display apparatus DD that is exposed to the outside, and an inner surface of the protection film PM defines an adhesion surface AS1 that adheres to the first adhesion member AM1. Hereinafter, the adhesion surface AS1 of the protection film PM may be referred to as a first adhesion surface AS1. The protection film PM effectively prevents external moisture from being permeated into the display member DM and absorbs an external impact.

The protection film PM may include a plastic film as a base layer. The protection film PM may include at least one selected from polyethersulphone ("PES"), polyacrylate ("PAR"), polyetherimide ("PEI"), polyethyelenen naphthalate ("PEN"), polyethyelenetrepthalate ("PET"), polyphenylene sulfide ("PPS"), polyallylate, polyimide ("PI"), polycarbonate ("PC"), poly(aryleneether sulfone), and a combination thereof.

A material of the protection film PM is not limited to a plastic resin. In one alternative embodiment, for example, the protection film PM may include an organic/inorganic composite material. The protection film PM may include a porous organic layer and an inorganic material that is filled into pores of the organic layer. The protection film PM may further include a functional layer disposed on the plastic film. The functional layer may include a resin layer. The functional layer may be coated on the plastic film or formed in a coating manner.

The window WM protects the display module DM against the external impact and provides an input surface to a user. An outer surface of the window WM defined a second outer surface OS-U of the display apparatus DD that is exposed to the outside and opposite to the first outer surface OS-L, and an inner surface of the window WM defines an adhesion surface AS2 that adheres to the second adhesion member AM2. The display surface IS of FIGS. 1A to 1C may be defined by the second outer surface OS-U. Hereinafter, the adhesion surface AS2 of the window WM may be referred to as a second adhesion surface AS2r.

The display module DM includes an organic light emitting display panel DP and a touch sensing unit TS, which are integrally formed through a continuous process. The organic light emitting display panel DP outputs an image (e.g., the image IM of FIG. 1A) corresponding to inputted image data. The organic light emitting display panel DP provides a first display panel surface BS1-L and a second display panel surface BS1-U, which face each other in the thickness direction DR3.

The touch sensing unit TS acquires coordinate information of an external input or detects a position of a touch on a surface thereon. The touch sensing unit TS may be directly disposed on the second display panel surface BS1-U. In an embodiment, as shown in FIGS. 2A and 2B, the touch sensing unit TS may be manufactured together with the organic light emitting display panel DP through the continuous process.

Although not separately shown, the display module DM according to an embodiment of the inventive concept may further include an antireflection layer. The antireflection layer may include a color filer, a laminated structure of a conductive layer/a dielectric layer/a conductive layer, or an optical member. The antireflection layer may absorb, destructively interfere with, or polarize external light, e.g., light incident from the outside, to reduce reflectance of the external light.

Each of the first adhesion member AM1 and the second adhesion member AM2 may include an optically clear adhesive ("OCA") film, an optically clear resin ("OCR"), or a pressure sensitive adhesive ("PSA") film. Each of the first adhesion member AM1 and the second adhesion member AM2 may include a photocurable adhesion material or a heat-curable adhesion material. However, the embodiment of the inventive concept is not particularly limited thereto.

Although not particularly shown, the display apparatus DD may further include a frame structure that supports the functional layers, e.g., layers shown in FIG. 2A, to maintain the states illustrated in FIGS. 1A to 1C. The frame structure may include a joint structure or a hinge structure.

A shape of a display apparatus DD-1 may be fixed in a predetermined shape, e.g., one of the shapes shown in FIGS. 1D and 1E, to operate, unlike the embodiment of the display apparatus DD of FIGS. 1A to 1C. The display apparatus DD-1 may be in a bent state as illustrated in FIG. 1E. The display apparatus DD-1 may be fixed to a frame in the bent state, and the frame may be coupled to a housing of an electronic device.

The display apparatus DD-1 of FIGS. 1D and 1E may be different from the display apparatus DD of FIGS. 1A to 1C in cross-section in the first direction DR1. In an embodiment of the display apparatus DD-1 of FIGS. 1D and 1E, the non-bendable area NBA and the bendable area BA may have laminated structures different from each other. In such an embodiment, the non-bendable area NBA may have the same cross-sectional structure as that of FIG. 2A, and the bendable area BA may have a cross-sectional structure different from that of FIG. 2A. In such an embodiment, an optical member LM and the window WM may not be disposed on the bent area BA. In such an embodiment, the optical member LM and the window WM may be disposed on only the non-bent area NBA. In such an embodiment, the second adhesion member AM2 and the third adhesion member AM3 may not be disposed on the bent area BA.

In an embodiment, as illustrated in FIG. 2B, the organic light emitting display panel DP includes a base layer SUB, a circuit layer DP-CL disposed on the base layer SUB, a light emitting element layer DP-OLED, and a thin film encapsulation layer TFE. The base layer SUB may include or defined by a plastic film. The base layer SUB may be a flexible substrate and include a plastic substrate, a glass substrate, a metal substrate, or an organic/inorganic composite substrate.

The circuit layer DP-CL may include a plurality of insulation layers, a plurality of conductive layers, and a semiconductor layer. The plurality of conductive layers of the circuit layer DP-CL may constitute signal lines or a circuit unit of a pixel. The light emitting element layer DP-OLED may include organic light emitting diodes. The thin film encapsulation layer TFE may be disposed on the light emitting element layer DP-OLED to seal the light emitting element layer DP-OLED. In one embodiment, for example, the thin film encapsulation layer TEF may include at least two inorganic thin films and an organic thin film disposed between the at least two inorganic thin films. The inorganic thin films protect the light emitting element layer DP-OLED against moisture, and the organic thin film protects the light emitting element layer DP-OLED against foreign substances such as dust particles.

In an embodiment, the touch sensing unit TS may be a single layer type. In such an embodiment, the touch sensing unit TS include a single conductive layer. Here, the single conductive layer means that "a conductive layer that is not divided into two separate conductive layers by an insulation layer therebetween". A laminated structure of a first metal layer/a second metal layer/a metal oxide layer may correspond to a signal conductive layer, and a laminated structure of a first meal layer/an insulation layer/a metal oxide layer may correspond to a double conductive layer.

The single conductive layer may be patterned to form sensors and touch signal lines. In such an embodiment, the sensors of the touch sensing unit TS may be in a same layer or disposed directly on a same layer. The sensors may be directly disposed on the thin film encapsulation layer TFE. In such an embodiment, a portion of each of the touch signal lines may be disposed in or directly on the same layer, and defines a sensor. A portion of each of the touch signal lines may be disposed on the circuit layer DP-CL. A structure of the touch sensing unit TS will be described later in greater detail.

Each of the touch signal lines and the sensors may include indium tin oxide ("ITO"), indium zinc oxide ("IZO"), zinc oxide (ZnO), or indium tin zinc oxide ("ITZO"), poly(3,4-ethylenedioxythiophene) ("PEDOT"), a metal nano wire, or graphene. Each of the touch signal lines and the sensors may include a metal layer including at least one material selected from, for example, molybdenum, silver, titanium, copper, aluminum, and an alloy thereof. The touch signal lines and the sensors may include a same material as each other or materials different from each other.

In an embodiment, the display module DM may include a single-layered touch sensing unit to simplify a structure thereof when compared to that of the multilayered touch sensing unit. In such an embodiment, the touch sensing unit TS is slim, such that stress generated in the touch sensing unit TS may be reduced when the display module DM is bent as illustrated in FIGS. 1B and 1C.

Figure 3A:
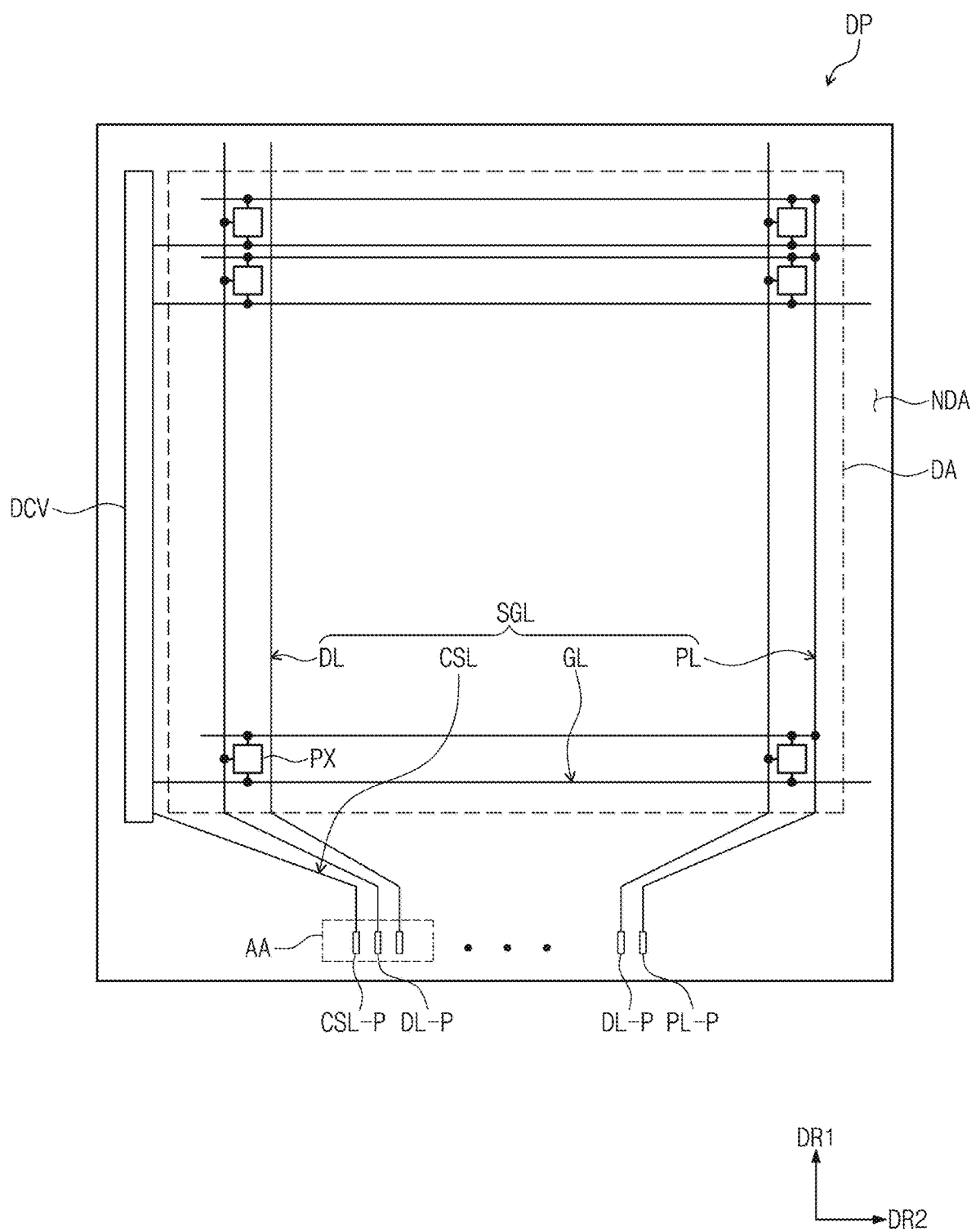
FIG. 3A is a plan view of an organic light emitting display panel according to an embodiment of the inventive concept.
Figure 3B:
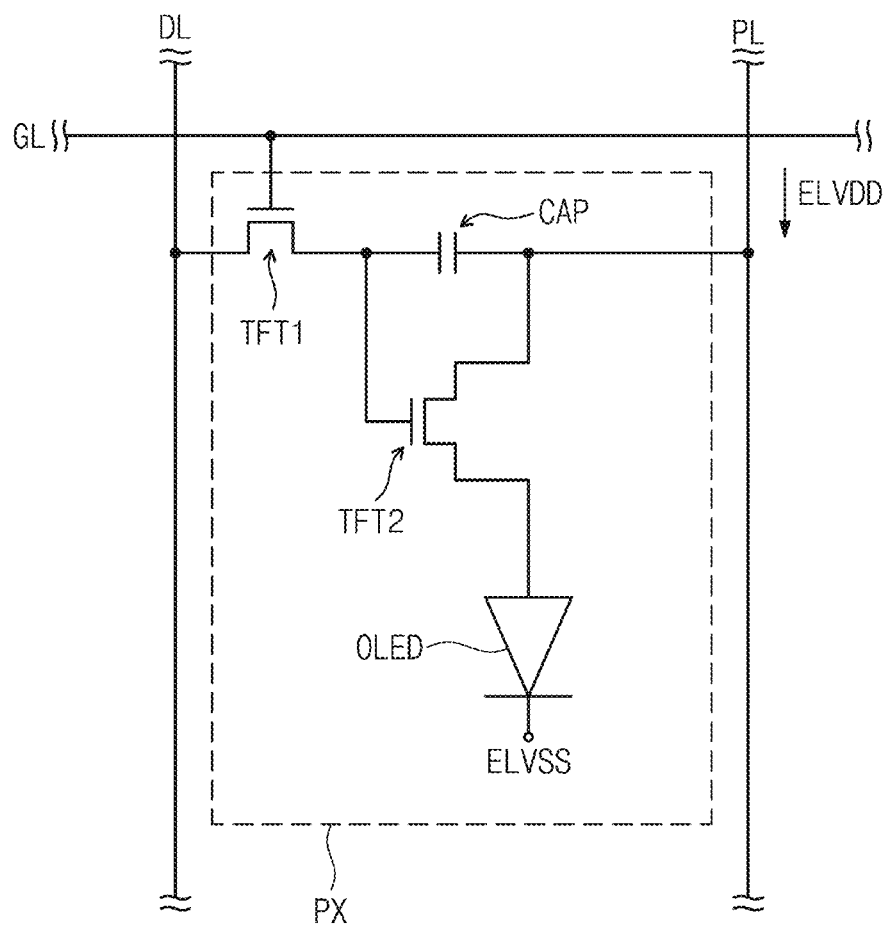
FIG. 3B is an equivalent circuit diagram of a pixel according to an embodiment of the inventive concept.
Figure 3C:
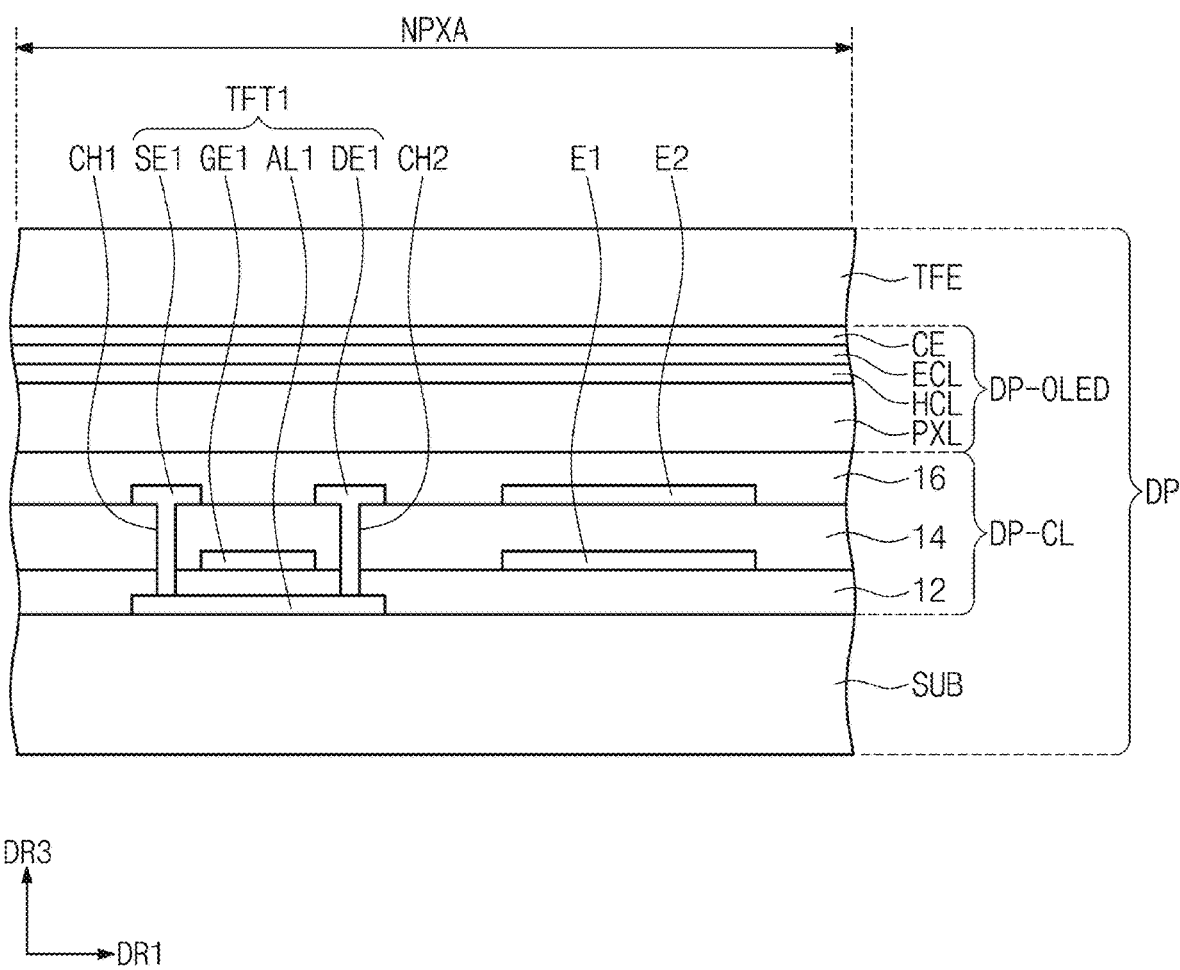
FIGS. 3C and 3D are partial cross-sectional views of the organic light emitting display panel according to an embodiment of the inventive concept.
Figure 3D:
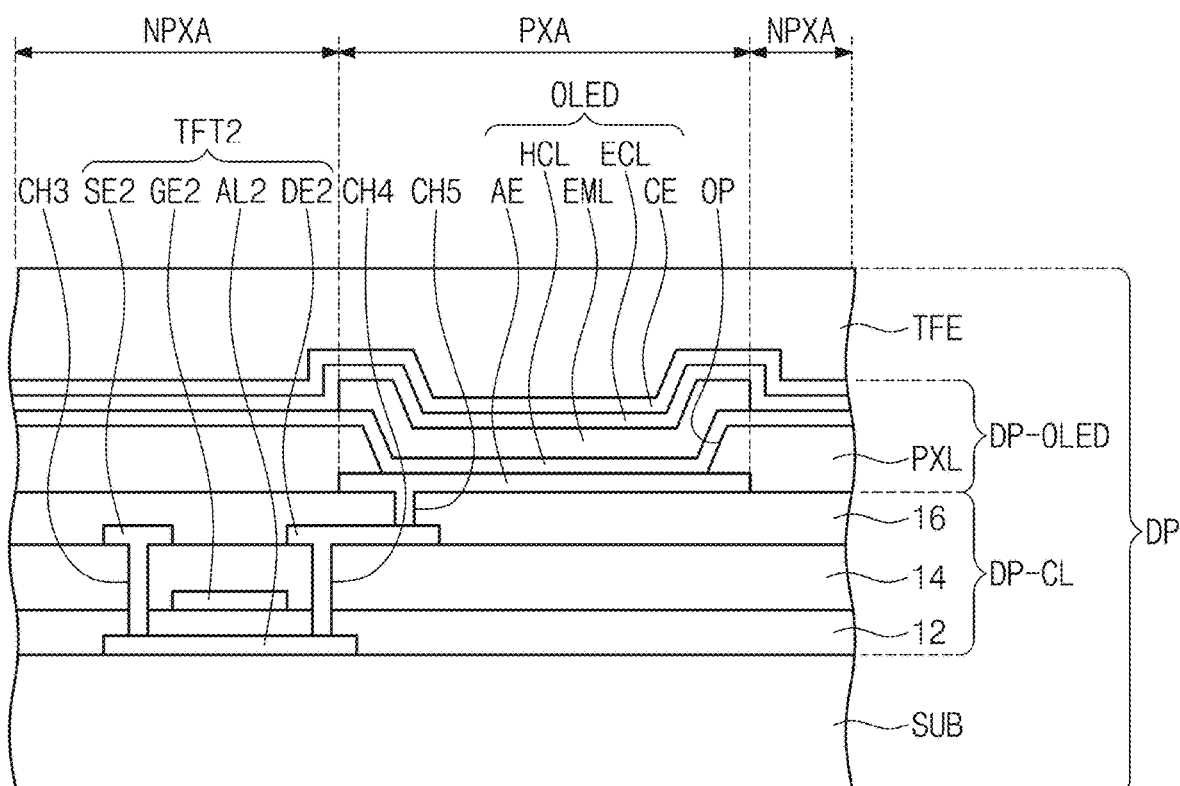
Figure 3E:
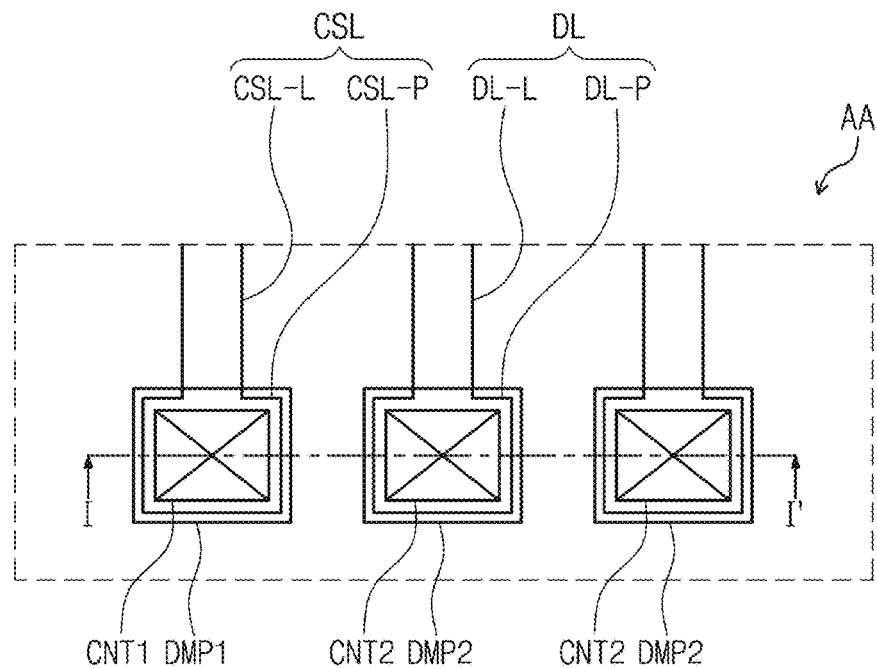
FIG. 3E is a plan view illustrating a pad area of the organic light emitting display panel according to an embodiment of the inventive concept.
Figure 3F:
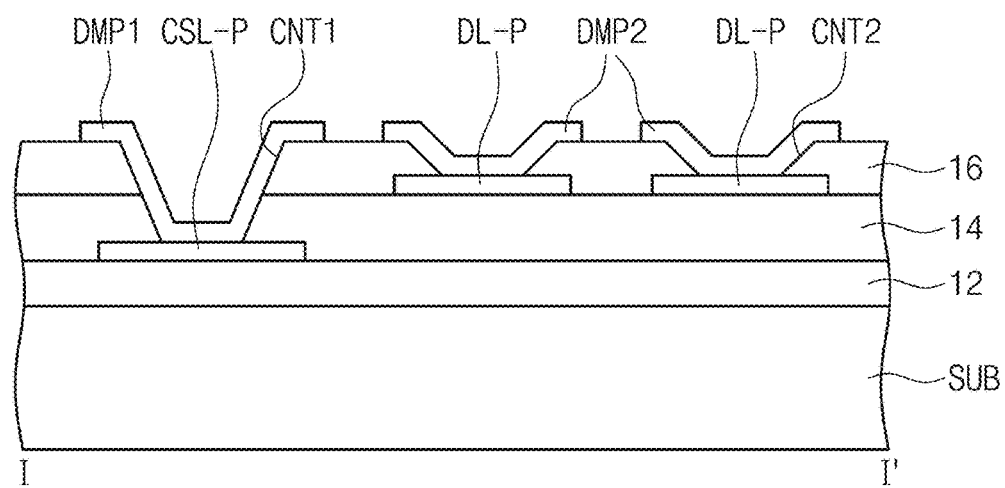
FIG. 3F is a cross-sectional view illustrating the pad area of the organic light emitting display panel according to an embodiment of the inventive concept.
Figure 3F:
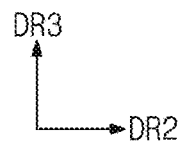

FIG. 3A is a plan view of the organic light emitting display panel DP according to an embodiment of the inventive concept. FIG. 3B is an equivalent circuit diagram of a pixel PX according to an embodiment of the inventive concept. FIGS. 3C and 3D are partial cross-sectional views of the organic light emitting display panel DP according to an embodiment of the inventive concept. FIG. 3E is a plan view illustrating a pad area of the organic light emitting display panel DP according to an embodiment of the inventive concept. FIG. 3F is a cross-sectional view illustrating the pad area of the organic light emitting display panel DP according to an embodiment of the inventive concept.

In an embodiment, as illustrated in FIG. 3A, the organic light emitting display panel DP include a display area and a non-display area NDA when viewed from a plan view. The display area DA and the non-display area NDA of the organic light emitting display panel DP may correspond to the display area DD-DA and the non-display area DD-NDA of the display apparatus DD, respectively, but not being limited thereto. In one embodiment, for example, the display area DA and the non-display area NDA of the organic light emitting display panel DP may be variously modified according to a structure/design of the organic light emitting display panel DP.

The organic light emitting display panel DP may include a plurality of signal lines SGL and a plurality of pixels PX connected to the signal lines SGL. An area, on which the plurality of pixels PX is disposed, may be defined as the display area DA. In an embodiment, as shown in FIG. 3A, the non-display area NDA may be defined along an edge of the display area DA.

The plurality of signal lines SGL includes gate lines GL, data lines DL, a power line PL, and a control signal line CSL. The gate lines GL are connected to corresponding pixels of the plurality of pixels PX, respectively, and the data lines DL are connected to corresponding pixels PX of the plurality of pixels PX, respectively. The power line PL is connected to the plurality of pixels PX. A gate driving circuit DCV, to which the gate lines GL are connected, may be disposed the non-display area NDA along a side. The control signal line CSL may provide control signals to the gate driving circuit DCV.

Some signal lines of the gate lines GL, the data lines DL, the power lines PL, and the control signal line CSL may be disposed in a same layer, and other signal lines may be disposed in another layer or a layer different from the same layer. In such an embodiment, the signal lines disposed in a same layer, among the gate lines GL, the data lines DL, the power lines PL and the control signal line CSL, may be defined as a first signal line, signal lines disposed in other layer, among the gate lines GL, the data lines DL, the power lines PL and the control signal line CSL, may be defined as a second signal line. The signal lines disposed in another layer, among the gate lines GL, the data lines DL, the power lines PL and the control signal line CSL, may be defined as a third signal line.

Each of the gate lines GL, the data lines DL, the power lines PL, and the control signal line CSL may include a signal line part and a signal pad part connected to an end of the signal line part. The signal line part of each of the gate lines GL, the data lines DL, the power lines PL and the control signal line CSL may be defined as a remaining portion except for the signal pad part thereof. In an embodiment, the signal pad part may be a control pad part CSL-P, a data pad part DL-P, or a power pad part PL-P, as shown in FIG. 3A. In an embodiment, a gate pad part (not shown) may be disposed to overlap the gate driving circuit DCV and to be connected to the gate driving circuit DCV. In such an embodiment, a portion of the non-display area NDA on which the control pad part CSL-P, the data pad part DL-P, and the power pad part PL-P are aligned may be defined as a pad area although not particularly illustrated. As described below, the pad parts of the touch sensing unit TS may be disposed adjacent to the pad parts of the above-described organic light emitting display panel DP.

FIG. 3B illustrates an exemplary embodiment of a pixel PX connected to a gate line GL, a data line DL, and the power line PL. However, the embodiment of the inventive concept is not limited to the configuration of the pixel. In one embodiment, for example, the configuration of the pixel PX may be variously modified.

The pixel PX includes an organic light emitting diode OLED as a display unit. The organic light emitting diode OLED may be a top emission-type diode or a bottom emission-type diode. The pixel PX includes a first transistor TFT1 (or a switching transistor), a second transistor TFT2 (or a driving transistor) and a capacitor CAP as a circuit unit for driving the organic light emitting diode OLED.

In an embodiment, as shown in FIG. 3B, the gate line GL is connected to a control electrode of the first transistor TFT1, a first electrode of the first transistor TFT1 is connected to the data line DL, and a second electrode of the first transistor TFT1 is connected to a first terminal (or electrode) of the capacitor CAP and a control electrode of the second transistor TFT2. The power line PL is connected to a first electrode of the second transistor TFT2 and a second terminal (or electrode) of the capacitor CAP to apply a first voltage ELVDD thereto. A second electrode of the second transistor TFT2 is connected to a first electrode (e.g., an anode) of the organic light emitting diode OLED, and a second voltage ELVSS is applied to a second electrode (e.g., a cathode) of the organic light emitting diode OLED.

The first transistor TFT1 outputs a data signal applied to the data line DL in response to a scanning signal applied to the gate line GL. The capacitor CAP charges a voltage corresponding to the data signal received from the first transistor TFT1.

The second transistor TFT2 is connected to the organic light emitting diode OLED. The second transistor TFT2 controls driving current, which corresponds to a charge amount stored in the capacitor CAP, to the organic light emitting diode OLED. The organic light emitting diode OLED emits light during a turn-on period of the second transistor TFT2.

FIG. 3C is a cross-sectional view of portions corresponding to the first transistor TFT1 and the capacitor CAP of the equivalent circuit of FIG. 3B. FIG. 3D is a cross-sectional view of portions corresponding to the second transistor TFT2 and the organic light emitting diode OLED of the equivalent circuit of FIG. 3B.

In an embodiment, as illustrated in FIGS. 3C and 3D, the circuit layer DP-CL is disposed on the base layer SUB. A semiconductor pattern AL1 (hereinafter, referred to as a first semiconductor pattern) of the first transistor TFT1 and a semiconductor pattern AL2 (hereinafter, referred to as a second semiconductor pattern) of the second transistor TFT2 are disposed on the base layer SUB. Each of the first and second semiconductor patterns AL1 and AL2 may include at least one selected from amorphous silicon, polysilicon, and a metal oxide semiconductor. The first and second semiconductor patterns AL1 and AL2 may include a same material as each other or different materials from each other.

Although not separately shown, a functional layer may be further disposed on a surface of the base layer SUB. The functional layer may include a barrier layer or a buffer layer.

The first and second semiconductor patterns AL1 and AL2 may be disposed on the functional layer, e.g., the barrier layer or the buffer layer.

A first insulation layer 12 covering the first and second semiconductor patterns AL1 and AL2 is disposed on the base layer SUB. The first insulation layer 12 includes an organic layer and/or an inorganic layer. In an embodiment, the first insulation layer 12 may include a plurality of inorganic thin films. The plurality of inorganic thin films may include a silicon nitride layer and a silicon oxide layer.

A control electrode GE1 (hereinafter, referred to as a first control electrode) of the first transistor TFT1 and a control electrode GE2 (hereinafter, referred to as a second control electrode) of the second transistor TFT2 are disposed on the first insulation layer 12. A first electrode E1 of the capacitor CAP is disposed on the first insulation layer 12. The first control electrode GE1, the second control electrode GE2, and the first electrode E1 may be manufactured by a same photolithograph process as that of the gate lines GL (see FIG. 3A). In one embodiment, for example, the first electrode E1 may be formed of the same material, have the same laminated structure, and be disposed in or directly on the same layer as the gate lines GL.

A second insulation layer 14 covering the first and second control electrodes GE1 and GE2 and the first electrode E1 is disposed on the first insulation layer 12. The second insulation layer 14 includes an organic layer and/or an inorganic layer. In one embodiment, for example, the second insulation layer 14 may include a plurality of inorganic thin films. The plurality of inorganic thin films may include a silicon nitride layer and a silicon oxide layer.

The data lines DL (see FIG. 3A) may be disposed on the second insulation layer 14. An input electrode SE1 (hereinafter, referred to as a first input electrode) and an output electrode DE1 (hereinafter, referred to as a first output electrode) of the first transistor TFT1 are disposed on the second insulation layer 14. An input electrode SE2 (hereinafter, referred to as a second input electrode) and an output electrode DE2 (hereinafter, referred to as a second output electrode) of the second transistor TFT2 are disposed on the second insulation layer 14. The first input electrode SE1 is connected to or branched from a corresponding data line of the data lines DL. The power line PL (see FIG. 3A) may be disposed in or directly on the same layer as the data lines DL. The second input electrode SE2 may be connected to or branched from the power line PL.

A second electrode E2 of the capacitor CAP is disposed on the second insulation layer 14. The second electrode E2 may be manufactured by the same photolithograph process as that of each of the data line DL and the power line PL. In one embodiment, for example, the second electrode E2 may be formed of the same material, have the same structure, and be disposed in or directly on the same layer as that of each of the data line DL and the power line PL.

The first input electrode SE1 and the first output electrode DE1 are connected to the first semiconductor pattern AL1 through first and second through holes CH1 and CH2, which are defined through the first and second insulation layers 12 and 14, respectively. The first output electrode DE1 may be electrically connected to the first electrode E1. In one embodiment, for example, the first output electrode DE1 may be connected to the first electrode E1 through a through hole (not shown) defined through the second insulation layer 14. The second input electrode SE2 and the second output electrode DE2 are connected to the second semiconductor pattern AL2 through third and fourth through holes CH3 and CH4, which are defined through the first and second insulation layers 12 and 14, respectively. According to an alternative embodiment of the inventive concept, each of the first and second transistors TFT1 and TFT2 may have a bottom gate structure.

A third insulation layer 16 covering the first input electrode SE1, the first output electrode DE1, the second input electrode SE2 and the second output electrode DE2 is disposed on the second insulation layer 14. The third insulation layer 16 includes an organic layer and/or an inorganic layer. In one embodiment, for example, the third insulation layer 16 may include an organic material to provide a flat surface.

In such an embodiment, one of the first, second, and third insulation layers 12, 14, and 16 may be omitted according to the circuit structure of the pixel. Each of the second and third insulation layers 14 and 16 may be defined as an interlayer dielectric layer. The interlayer dielectric layer may be disposed between a lower conductive pattern and an upper conductive pattern to insulate the conductive patterns from each other.

The circuit layer DP-CL includes dummy conductive patterns. The dummy conductive patterns are disposed in or directly on the same layer as the semiconductor patterns AL1 and AL2, the control electrodes GE1 and GE2, or the output electrodes DE1 and DE2. The dummy conductive patterns may be disposed in the non-display area NDA (see FIG. 3A). The dummy conductive patterns will be described later in detail.

The light emitting element layer DP-OLED is disposed on the third insulation layer 16. The light emitting element layer DP-OLED may include a pixel defining layer PXL and the organic light emitting diode OLED, which are disposed on the third insulation layer 16. The organic light emitting diode OLED includes an anode AE disposed on the third insulation layer 16. The anode AE is connected to the second output electrode DE2 through a fifth through hole CH5 passing through the third insulation layer 16. An opening OP is defined in the pixel defining layer PXL. The opening OP of the pixel defining layer PXL exposes at least a portion of the anode AE.

The light emitting element layer DP-OLED may include an emission area PXA and a non-emission area NPXA that is adjacent to the emission area PXA. The non-emission area NPXA may surround the emission area PXA. In an embodiment, as shown in FIG. 3D, the emission area PXA is defined to correspond to the anode AE. However, the embodiment of the inventive concept is not limited to the above-described emission area PXA. In an embodiment, when light is emitted from an area, the area may be defined as the emission area PXA. The emission area PXA may be defined to correspond to a portion of the anode AE, which is exposed by the opening OP. The organic light emitting diode OLED may further include a hole control layer HCL commonly disposed on the emission area PXA and the non-emission area NPXA. Although not particularly shown, a common layer such as the hole control layer HCL may be commonly disposed on the plurality of pixels PX (see FIG. 3A). In an embodiment, the organic light emitting diode OLED may further include a portion of the common layer HCL in the emission area PXA.

The organic light emitting diode OLED may further include an organic light emitting layer EML disposed on the hole control layer HCL. The organic light emitting layer EML may be disposed on only an area corresponding to the emission area PXA or the opening OP. In such an embodiment, the organic light emitting layer EML of each of the plurality of pixels PX may be separated or spaced apart from each other.

The organic light emitting diode OLED may further include an electronic control layer ECL disposed on the organic light emitting layer EML, and a portion of a cathode CE disposed on the electronic control layer ECL in the emission area PXA. The cathode CE is commonly disposed on the plurality of pixels PX and in the emission area PXA and the non-emission area NPXA.

In an embodiment, as described above, the organic light emitting layer EML may be patterned to be separately disposed in each of the plurality of pixels PX, but not being limited thereto. Alternatively, the organic light emitting layer EML may be commonly disposed on the plurality of pixels PX. In such an embodiment, the organic light emitting layer EML may emit white light. In an embodiment, the organic light emitting layer EML may have a multilayer structure.

In an embodiment, as shown in FIG. 3D, the thin film encapsulation layer TFE directly covers the cathode CE. In an embodiment, a capping layer may be further disposed on the cathode CE to cover the cathode CE. In such an embodiment, the thin film encapsulation layer TFE directly covers the capping layer.

FIG. 3E is an enlarged view of an area AA of FIG. 3A, and FIG. 3F is a cross-sectional view taken along line I-I' of FIG. 3E. The control signal line CSL includes the control line part CSL-L and the control pad part CSL-P. The data line DL includes a data line part DL-L and a data pad part DL-P.

Dummy patterns DMP1 and DMP2 are disposed on the third insulation layer 16. In an embodiment, the dummy patterns DMP1 and DMP2 may be manufactured by the same photolithograph process as that of the anode AE. In such an embodiment, each of the dummy patterns DMP1 and DMP2 may be formed of the same material, have the same laminated structure, and be disposed in or directly on the same layer, e.g., the second insulation layer 14, as the anode AE.

Each of the dummy patterns DMP1 and DMP2 may be a floating electrode. The dummy patterns DMP1 and DMP2 may not be connected to other conductive patterns in the same layer. The dummy patterns DMP1 and DMP2 are not connected to other portions except for the corresponding pad parts. The first dummy pattern DMP1 is connected to the control pad part CSL-P through a first contact hole CNT1. The second dummy pattern DMP2 is connected to the data pad part DL-P through a second contact hole CNT2. The first contact hole CNT1 passes through the second insulation layer 14 and the third insulation layer 16. The second contact hole CNT2 passes through the third insulation layer 16.

Although not particularly shown in FIGS. 3E and 3F, a cross-section corresponding to the power pad part PL-P (shown in FIG. 3A) may be substantially the same as that corresponding to the dummy pad part DL-P.

In an embodiment of the inventive concept, the dummy patterns DMP1 and DMP2 may constitute a portion of the touch sensing unit TS. The dummy patterns DMP1 and DMP2 may be manufactured by the same photolithograph process as that of touch signal lines that will be described later. In such an embodiment, each of the dummy patterns DMP1 and DMP2 may be formed of the same material, have the same laminated structure, and be disposed in or directly on the same layer as the touch signal lines.

Figure 4A:
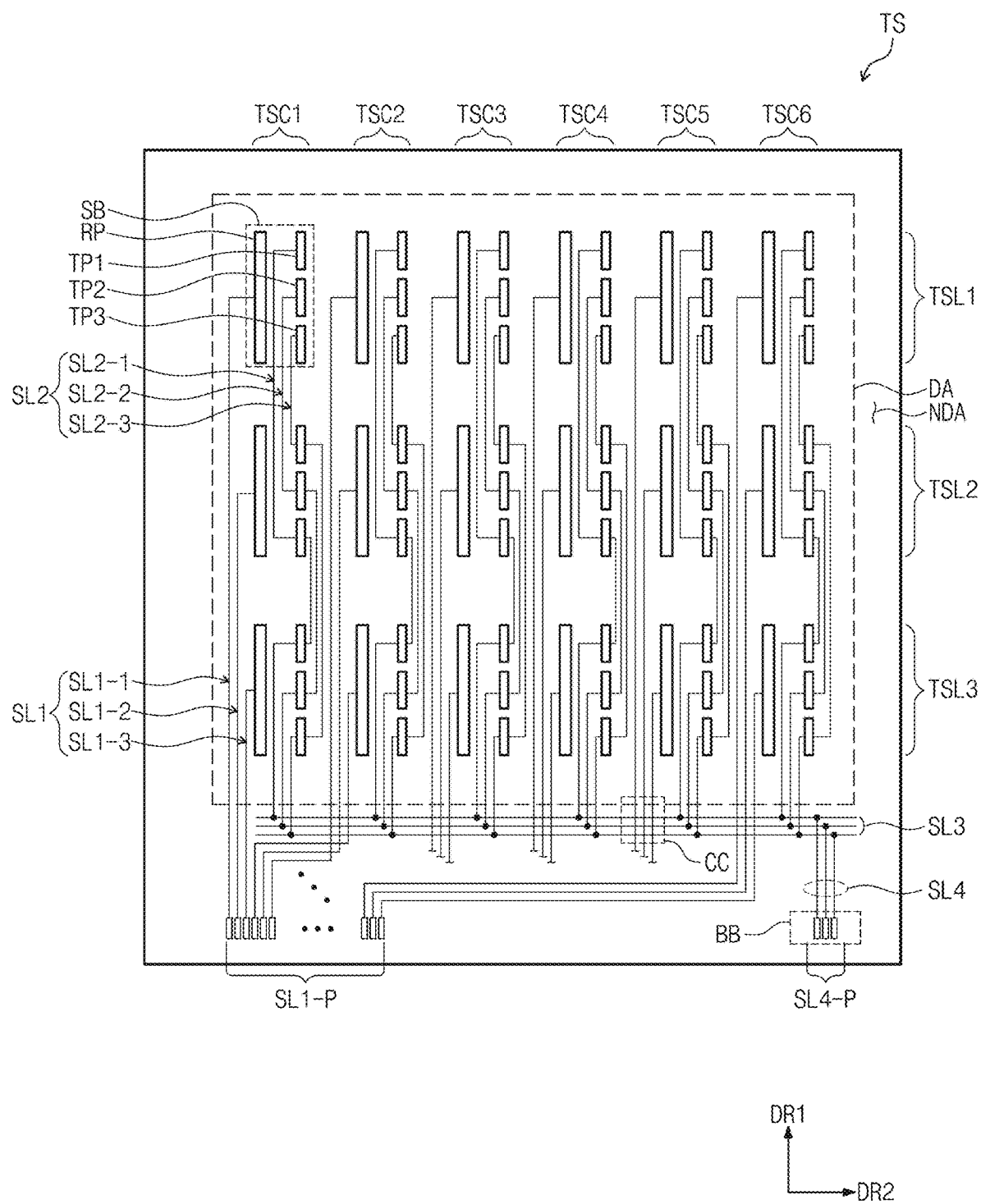
FIG. 4A is a plan view of a touch sensing unit according to an embodiment of the inventive concept.
Figure 4B:
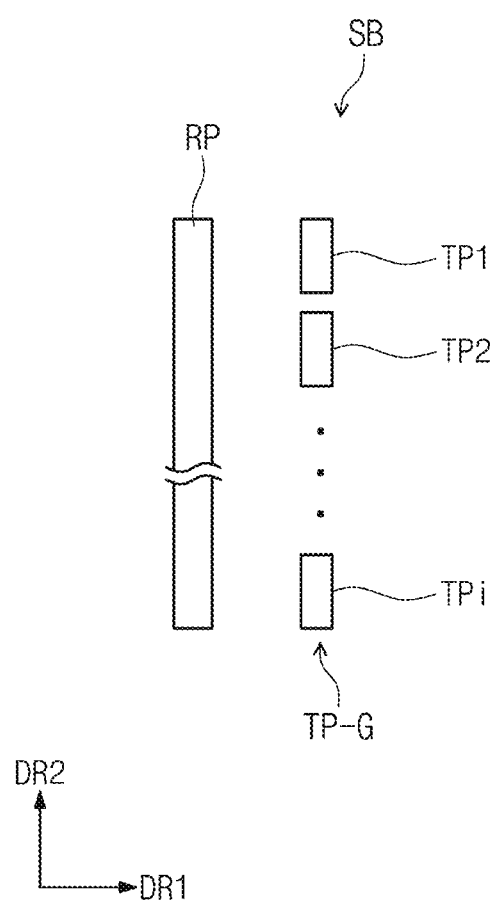
FIG. 4B is a plan view of a sensor block according to an embodiment of the inventive concept.
Figure 4C:
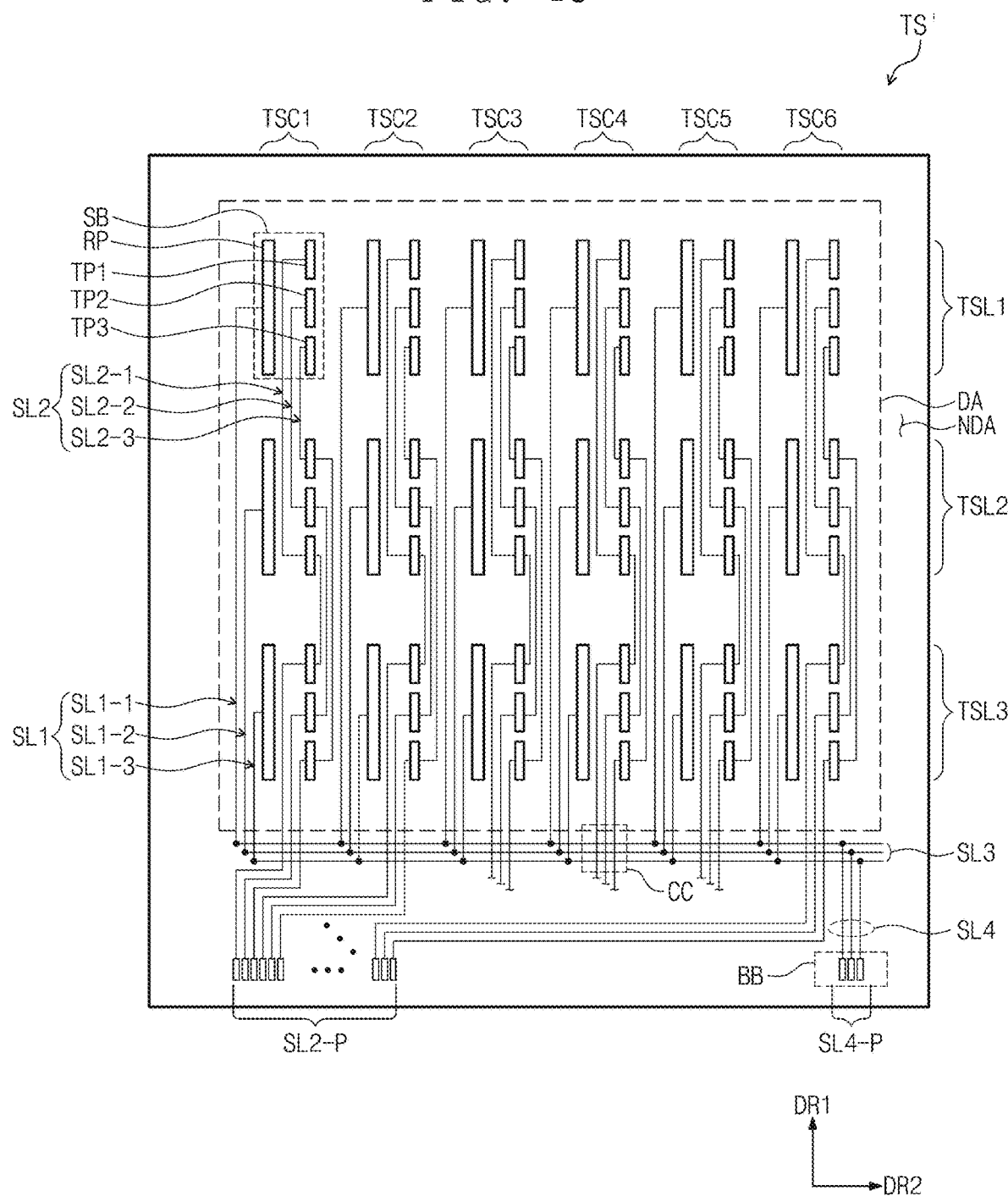
FIG. 4C is a plan view of a touch sensing unit according to an alternative embodiment of the inventive concept.

FIG. 4A is a plan view of the touch sensing unit TS according to an embodiment of the inventive concept. FIG. 4B is a plan view of a sensor block SB according to an embodiment of the inventive concept. FIG. 4C is a plan view of a touch sensing unit according to an alternative embodiment of the inventive concept.

In an embodiment, as illustrated in FIG. 4A, the touch sensing unit TS includes a touch sensor and a plurality of touch signal lines SL1 to SL4 connected to the touch sensor. The touch sensor includes a plurality of sensor blocks SB disposed on the display area DA. The thin film encapsulation layer TFE (see FIG. 2B) may overlap at least display area DA, and the sensor blocks SB may be directly disposed on the thin film encapsulation layer TFE. A portion of the plurality of touch signal lines SL1 to SL4 may be disposed on the thin film encapsulation layer TFE. A portion of each of the touch signal lines SL1 may be disposed on the thin film encapsulation layer TFE, and the other portion may be disposed on the third insulation layer 16 (see FIGS. 6A to 6D).

The sensor blocks SB may be arranged in a matrix form having a plurality of sensor columns TSC1 to TSC6 or a plurality of sensor rows TSL1 to TSL3. Each of the plurality of sensor columns TSC1 to TSC6 may include a plurality of sensor blocks SB arranged in a column direction (the first direction DR1 in FIG. 4A). The plurality of columns TSC1 to TSC6 are arranged in a row direction (the second direction DR2 in FIG. 4A).

In an embodiment, as shown in FIG. 4A, the plurality of sensor blocks SB may be arranged in the form of a matrix, but the embodiment of the inventive concept is not limited thereto. Alternatively, the plurality of sensor columns TSC1 to TSC6 may include the sensor blocks SB having numbers different from each other, and the plurality of sensor rows TSL1 to TSL3 may include the sensor blocks SB having numbers different from each other. The plurality of sensor columns TSC1 to TSC6 and/or the plurality of sensor rows TSL1 to TSL3 may be defined in a diagonal direction on the thin film encapsulation layer TFE.

In an embodiment, as illustrated in FIG. 4B, each of the plurality of sensor blocks SB includes a first sensor RP and a plurality of second sensors TP1 to TPi. The first sensor RP is spaced apart or separated from the plurality of second sensors TP1 to TPi. Each sensor block SB may include a single first sensor RP and i (where i is a natural number equal to or greater than 2) second sensors TP1 to TPi that are disposed adjacent to the first sensor RP and arranged in a predetermined direction. The i second sensors TP1 to TPi may form one sensor group. The second sensors TP1 to TPi may be arranged in the substantially the same direction as an extending direction of the first sensor RP.

Here, the number of sensor blocks SB, for example, "one first sensor" or "the plurality of first sensors" may be determined according to the number of first sensors that are electrically insulated. In an embodiment, where a sensor block SB has a sensor constituted by two separate patterns electrically connected by the touch signal line, the two conductive patterns may be defined as a single first sensor. The number of the second sensors TP1 to TPi may be determined by the number of patterns electrically disconnected or insulated from each other. That is, the i second sensors TP1 to TPi of FIG. 4B are electrically separated from each other in each sensor block SB. FIG. 4A illustrates an exemplary embodiment, where each sensor block SB includes three second sensors TP1 to TP3.

Hereinafter, a structure of an exemplary embodiment in which first to six sensor columns TSC1 to TSC6 are arranged from a left side to a right side, first to third sensor rows TSL1 to TSL3 are arranged from an upper side to a lower side, and first to i-th second sensors TP1 to TPi are arranged from an upper side to a lower side as shown in FIG. 4A will be described in detail.

When the plurality of second sensors TP1 to TPi receive a detection signal (or a transmission signal) for detecting the external input, the first sensor RP is capacitively coupled to the plurality of second sensors TP1 to TPi. When an input unit (e.g., a finger or a pen) is provided (e.g., touched) on a specific second sensor of the first sensor RP and the plurality of second sensors TP1 to TPi, which are capacitively coupled to each other, capacity between the first sensor RP and the specific second sensor may change. A touch detection circuit detects the changing capacity from the specific second sensor to calculate coordinate information of the input unit or to detect a position of the input unit on the touch sensing unit TS.

The first sensor RP receives a detection signal for detecting the position of the external input. Here, the touch detection circuit detects the changing capacity from the specific second sensor to calculate coordinate information of the input unit or detect a position of the input unit on the touch sensing unit TS.

A connection relationship between the plurality of sensor blocks SB and the plurality of touch signal lines SL1 to SL4 will be described with reference to FIG. 4A. The connection relationship between the plurality of sensor blocks SB and the plurality of touch signal lines SL1 to SL4 will be described on the basis of the first sensor column TSC1 and the second sensor column TSC2.

The touch signal lines SL1 to SL4 includes first touch signal lines SL1, second touch signal lines SL2, third touch signal lines SL4, and fourth touch signal lines SL4. The first touch signal lines SL1 are connected to the first sensors RP of the sensor blocks SB of the first sensor column TSC1, respectively.

The first touch signal lines SL1 may include a touch line part and a touch pad part SL1-P connected to an end of the touch line part. The touch line part may be defined as a portion except for the touch pad part SL1-P of each of the first touch signal lines SL1. The touch pad parts SL1-P of the first touch signal lines SL1 may be aligned in the non-display area NDA.

The second touch signal lines SL2 connects a j-th (where j is a natural number that is equal to or greater than 1 and equal to or less than i) second sensor of i second sensors of a sensor block (e.g., an n-th sensor block) of the sensor blocks SB of the sensor column to an (i-j+1)-th second sensor of the i second sensors of a next sensor block (e.g., an (n+1)-th sensor block). Hereinafter, three second signal lines SL2-1, SL2-2 and SL2-3 corresponding to the first sensor column TSC1 will be described in detail.

A first second touch signal line SL2-1 connects a first second sensor TP1 of the first sensor block SB in a sensor column, a third second sensor TP3 of the second sensor block SB in the sensor column, and the first second sensor TP1 of the third sensor block SB in the sensor column to each other. A second second touch signal line SL2-2 connects second sensors TP2 of the first to third sensor blocks SB in the sensor column to each other. A third second touch signal line SL2-3 connects the third second sensor TP3 of the first sensor block SB in the sensor column, the first second sensor TP1 of the second sensor block SB in the sensor column, and the third second sensor TP3 of the third sensor block SB in the sensor column to each other.

The second touch signal lines SL2 corresponding to the first sensor column TSC1 and the second touch signal lines SL2 corresponding to the second sensor column TSC2 may be connected to each other through the third touch signal lines SL3. The number of the third touch signal lines SL3 may be the same as that of the second sensors disposed in one sensor block. In an embodiment, where each sensor block includes i second sensors TP1 to TPi, i third touch signal lines SL3 may be provided. An embodiment, where three third touch signal lines SL3 are provided, is illustrated in FIG. 4A for convenience of description, but the embodiment of the inventive concept is not limited thereto.

In such an embodiment, as shown in FIG. 4A, the first second touch signal line SL2-1 corresponding to the first sensor column TSC1 and the first second touch signal line SL2-1 corresponding to the second sensor column TSC2 are connected to each other through one third touch signal line SL3 of three third touch signal lines SL3. The second second touch signal line SL2-2 corresponding to the first sensor column TSC1 and the second second touch signal line SL2-2 corresponding to the second sensor column TSC2 are connected to each other through another third touch signal line SL3 of three third touch signal lines SL3. The corresponding second sensors TP1, TP2, and TP3 disposed in the plurality of sensor columns TSC1 to TSC6 are electrically connected to each other through the third touch signal line SL3.

In an embodiment, the number of the fourth touch signal lines SL4 may be the same as that of third touch signal lines SL3. In an embodiment, where i third touch signal lines SL3 are provided, i fourth touch signal lines SL4 may be provided. The i fourth touch signal lines SL4 are connected in one-to-one correspondence to the i third touch signal lines SL3.

The fourth touch signal lines SL4 may include a touch line part and a touch pad part SL4-P connected to an end of the touch line part. The touch line part may be defined as a portion except for the touch pad part SL4-P of each of the fourth touch signal lines SL4. The touch pad parts SL4-P of the fourth touch signal lines SL4 may be aligned on the non-display area NDA.

In an embodiment, the number of pads may be reduced by the third touch signal lines SL3 and the fourth touch signal lines SL4. Thus, in such an embodiment, short circuit defects occurring in the pad area of the touch sensing unit TS may be reduced.

FIG. 4C shows an alternative embodiment of the touch sensing unit TS. The touch sensing unit TS' of FIG. 4C is substantially the same as the touch sensing unit TS of FIG. 4A except for the connection relationship between the touch sensing unit TS and the touch signal lines. The same or like elements shown in FIG. 4C have been labeled with the same reference characters as used above to describe the embodiments of the touch sensing unit TS shown in FIG. 4A, and any repetitive detailed description thereof will hereinafter be omitted or simplified.

In such an embodiment, each of the second touch signal lines SL2 may include a touch line part and a touch pad part SL2-P connected to an end of the touch line part. The first touch signal lines SL1 corresponding to the first sensor column TSC1 and the first touch signal lines SL1 corresponding to the second sensor column TSC2 may be connected to each other through the third touch signal lines SL3. The number of the third touch signal lines SL3 may be the same as that of first sensors disposed in one sensor column. An embodiment, where three third touch signal lines SL3 are provided is illustrated in FIG. 4C for convenience of illustration, but the embodiment of the inventive concept is not limited thereto.

The first first sensor RP of the first sensor column TSC1 and the first first sensor RP of the second sensor column TSC2 are connected to each other through one third touch signal line SL3 of the three third touch signal lines SL3. The second first sensor RP of the first sensor column TSC1 and the second first sensor RP of the second sensor column TSC2 are connected to each other through another third touch signal line SL3 of the three third touch signal lines SL3. The third first sensor RP of the first sensor column TSC1 and the third first sensor RP of the second sensor column TSC2 are connected to each other through the other third touch signal line SL3 of the three third touch signal lines SL3. The number of the fourth touch signal lines SL4 may be the same as that of third touch signal lines SL3. In an embodiment, where each sensor column includes i first sensors, i fourth touch signal lines SL4 may be provided.

Figure 5A:
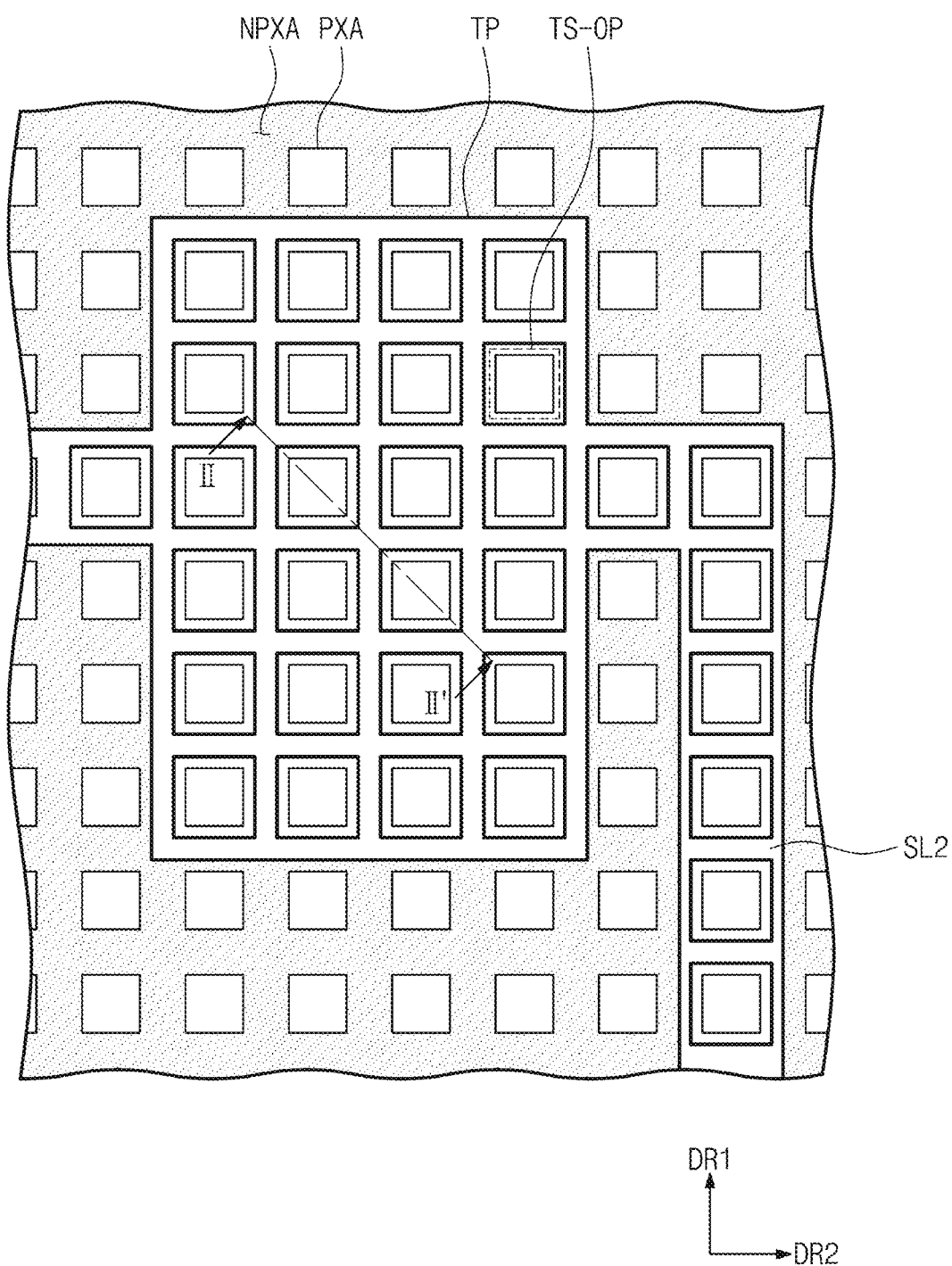
FIG. 5A is an enlarged plan view of a touch sensor and a touch signal line according to an embodiment of the inventive concept.
Figure 5B:
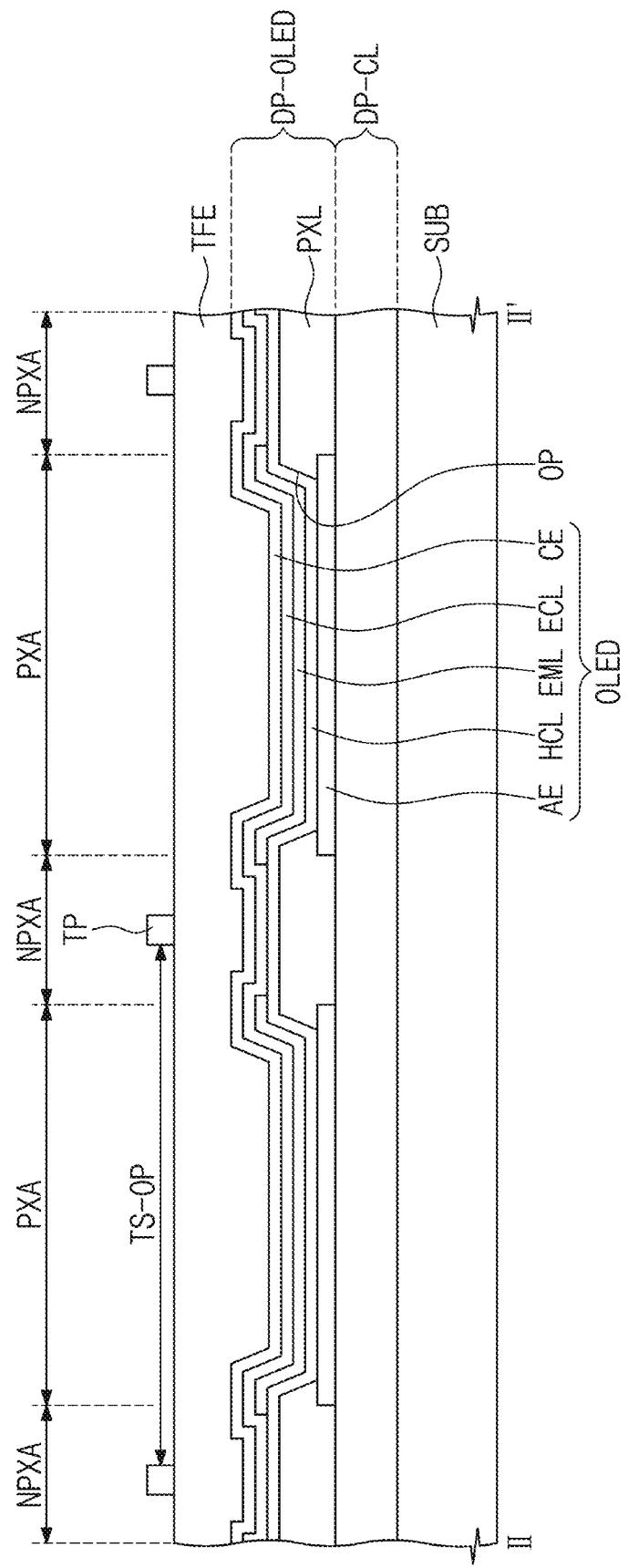
FIG. 5B is a cross-sectional view of a display module according to an embodiment of the inventive concept.

FIG. 5A is an enlarged plan view of the touch sensor TP and the touch signal line SL2 according to an embodiment of the inventive concept. FIG. 5B is a cross-sectional view of a display module DM according to an embodiment of the inventive concept. FIG. 5A illustrates one second sensor TP and a portion of the second touch signal line SL2 connected to the second sensor TP. FIG. 5B is a cross-sectional view taken along line II-II' of FIG. 5A. The organic light emitting display panel shown in FIG. 5B is substantially the same as the organic light emitting display panel described above with reference to FIG. 3C, and any repetitive detailed description thereof will be omitted.

The display area DA includes a plurality of emission areas PXA and a non-emission area NPXA surrounding the plurality of emission areas PXA. Each of the second sensor TP and the second touch signal line SL2 may have a mesh shape overlapping the non-emission area NPXA and exposing the emission areas PXA. Although not particularly shown, the first sensor RP may have a mesh shape as the second sensor TP.

The second sensor TP includes a plurality of vertical parts extending in the first direction DR1 and a plurality of horizontal parts extending in the second direction DR2. The plurality of vertical parts and the plurality of horizontal parts may define mesh lines. Each of the mesh lines may have a line width of several micrometers.

The plurality of vertical parts and the plurality of horizontal parts may be connected to each other, thereby defining a plurality of touch openings TS-OP. One touch opening TS-OP is illustrated as a dotted line in FIG. 5A. In an embodiment, the touch openings TS-OP may be arranged in one-to-one correspondence with the light emitting areas PXA, as illustrated in FIG. 5A, but the embodiment of the inventive concept is not limited thereto. Alternatively, one touch opening TS-OP may correspond to two or more light emitting areas PXA. Although the mesh line shown as being exposed to the outside in FIG. 6B, the display module DM may further include an insulation layer disposed on the thin film encapsulation layer TFE to cover the mesh line.

Figure 6A:
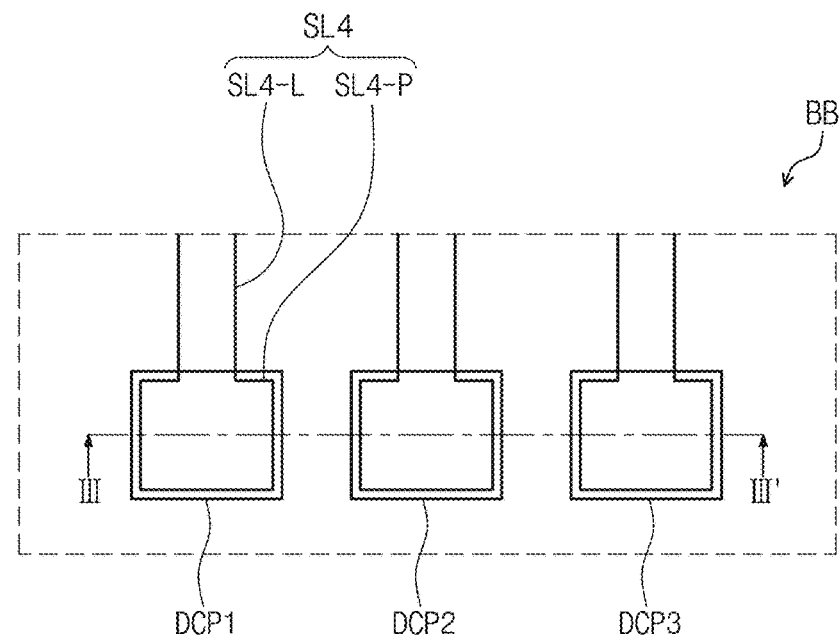
FIG. 6A is a plan view illustrating a pad area of the touch sensing unit according to an embodiment of the inventive concept.
Figure 6B:
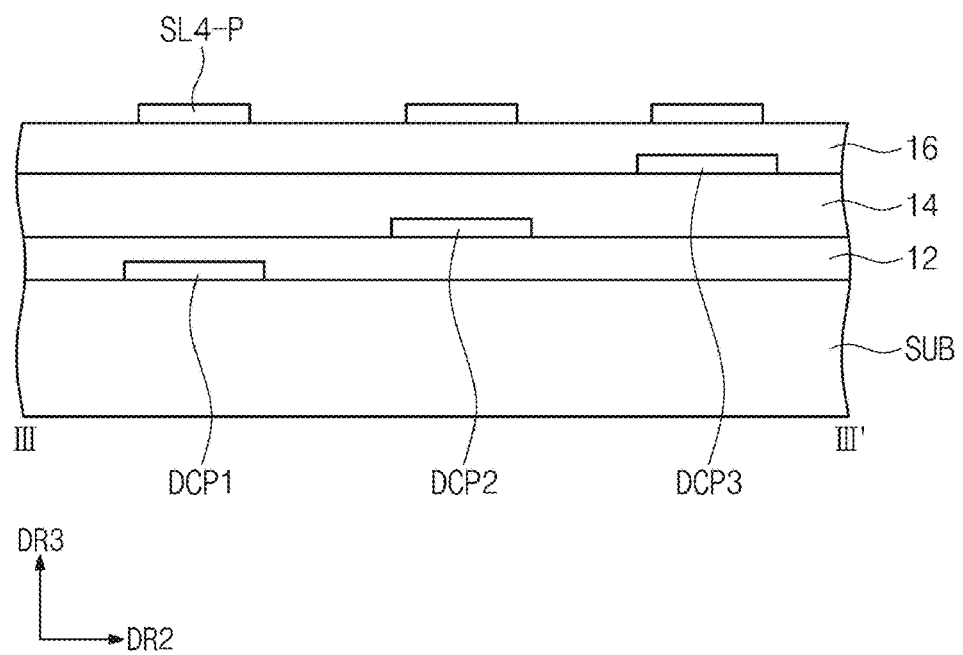
FIG. 6B is a cross-sectional view illustrating the pad area of the touch sensing unit according to an embodiment of the inventive concept.
Figure 6C:
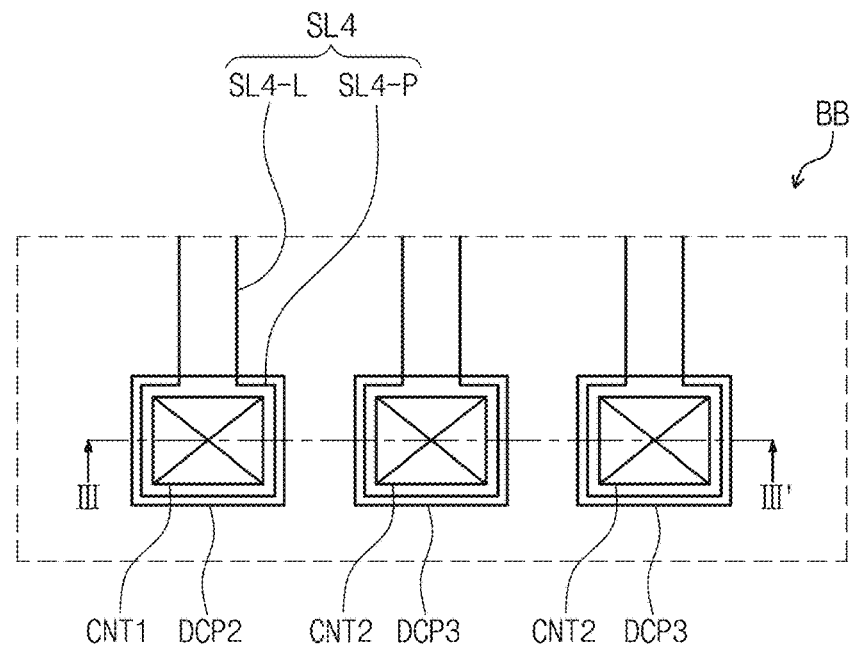
FIG. 6C is a plan view illustrating a pad area of the touch sensing unit according to an embodiment of the inventive concept.
Figure 6D:
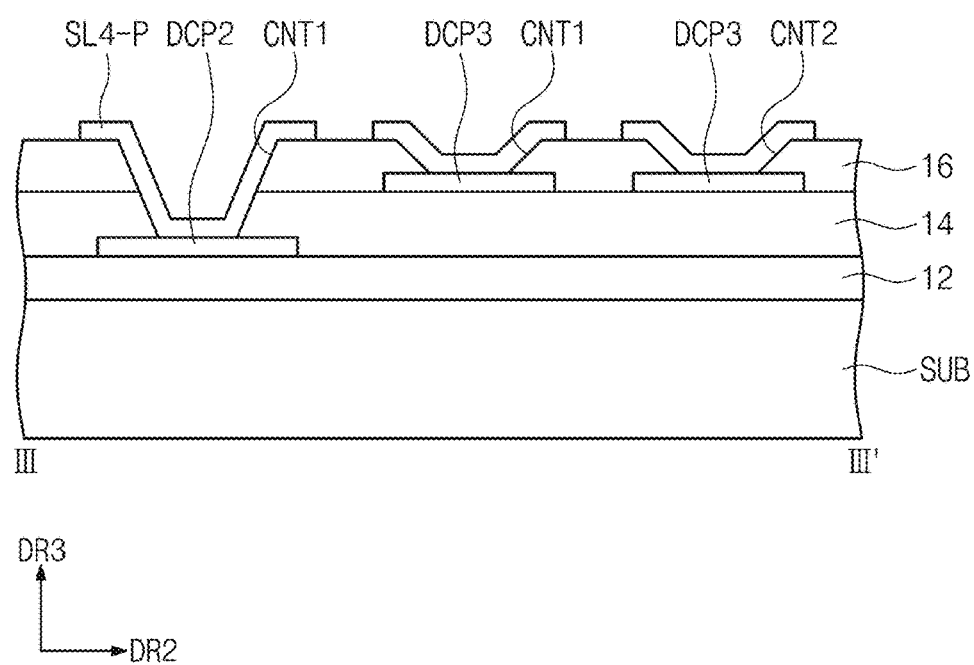
FIG. 6D is a cross-sectional view illustrating the pad area of the touch sensing unit according to an embodiment of the inventive concept.
Figure 6E:
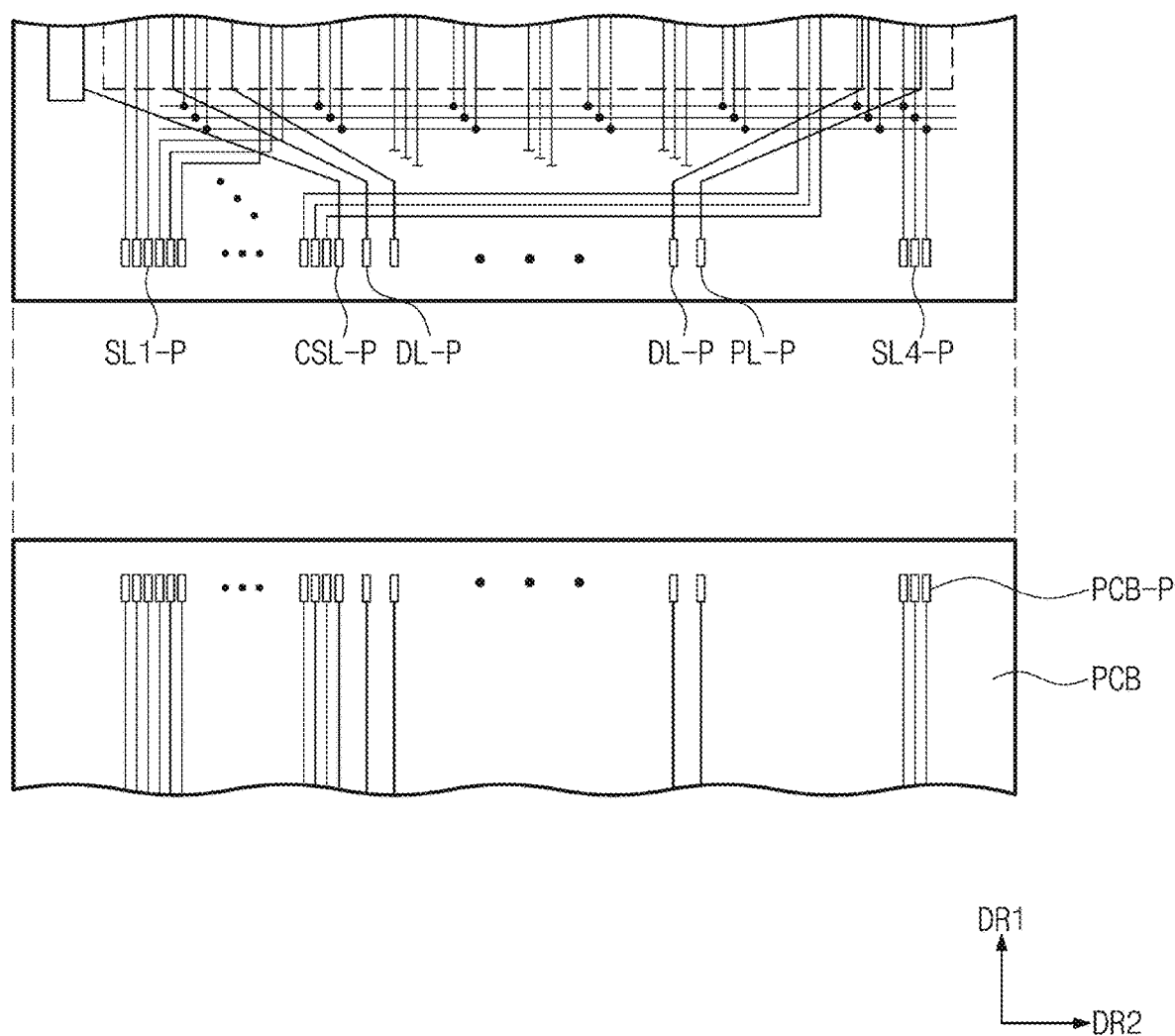
FIG. 6E is a plan view illustrating an arrangement relationship between the display module and a circuit board according to an embodiment of the inventive concept.

FIGS. 6A to 6D are plan and cross-sectional views illustrating the pad area of the touch sensing unit TS according to an embodiment of the inventive concept. FIG. 6A is an enlarged view of an area BB of FIG. 4A, and FIG. 6B is a cross-sectional view taken along line of FIG. 6A. FIG. 6C is an enlarged view of the area BB of FIG. 4A, and FIG. 6D is a cross-sectional view taken along line of FIG. 6C. FIG. 6E is a plan view illustrating an arrangement relationship between the display module DM and a circuit board PCB according to an embodiment of the inventive concept.

In an embodiment, as illustrated in FIGS. 6A and 6B, each of the fourth touch signal lines SL4 includes a touch line part SL4-L and a touch pad part SL4-P connected to an end of the touch line part SL4-L. The dummy conductive patterns described with reference to FIGS. 3A to 3F may include dummy conductive pads DCP1, DCP2 or DCP3 of FIGS. 6A and 6B. Each of the dummy conductive pads DCP1, DCP2 and DCP3 overlaps the touch pad part SL4-P.

The dummy conductive pads DCP1, DCP2 and DCP3 may include a first dummy conductive pad DCP1, a second dummy conductive pad DCP2, and a third dummy conductive pad DCP3, which are divided according to positions thereof on the cross-section. The first dummy conductive pad DCP1 may be manufactured through the same photolithography process as that of the first semiconductor pattern AL1 (see FIG. 3C). That is, the first dummy conductive pad DCP1 may be formed of the same material as the gate lines GL, have the same laminated structure as the gate lines GL, and be disposed in or directly on the same layer as the first semiconductor pattern AL1. The second dummy conductive pad DCP2 may be manufactured through the same photolithography process as that of the first semiconductor pattern AL1 (see FIG. 3C). The third dummy conductive pad DCP3 may be manufactured through the same photolithography process as that of the first input electrode (see FIG. 3C).

The dummy conductive pads DCP1, DCP2 or DCP3 may include at least one of the first dummy conductive pad DCP1, the second dummy conductive pad DCP2, and the third dummy conductive pad DCP3.

As illustrated in FIGS. 6C and 6D, the dummy conductive pads DCP1, DCP2, and DCP3 may include a second dummy conductive pad DCP2 and a third dummy conductive pad DCP3. One of the three touch pad parts SL4-P is connected to the second dummy conductive pad DCP2 through the first contact hole CNT1. Two of the three touch pad parts SL4-P are respectively connected to the third dummy conductive pad DCP3 through the second contact hole CNT2. The first contact hole CNT1 is defined through the second insulation layer 14 and the third insulation layer 16. The second contact hole CNT2 is defined through the third insulation layer 16.

Each of the dummy conductive pads DCP1, DCP2, and DCP3 may be a floating electrode. The dummy conductive pads DCP1, DCP2, and DCP3 may not be connected to other conductive patterns directly on a same layer. The dummy conductive pads DCP1, DCP2, and DCP3 may not be connected to other touch pad parts except for the corresponding touch pad parts.

As illustrated in FIG. 6E, the touch pad parts SL1-P and SL4-P of the touch sensing unit TS may be aligned with the signal pad parts CSL-P, DL-P, and PL-P of the organic light emitting display panel DP. The touch pad parts SL1-P and SL4-P and the signal pad parts CSL-P, DL-P, and PL-P may be aligned with each other to define the pad area of the display apparatus. The touch sensing unit TS and the organic light emitting display panel DP may be bonded or connected to a single circuit board PCB on the pad area. Here, the touch sensing unit TS and the organic light emitting display panel DP may be bonded to a single circuit board PCB through an anisotropic conductive film ("ACF") or a solder bump. The circuit board PCB may be a flexible circuit board and include pads PCB-P corresponding to the touch pad parts SL1-P and SL4-P and the signal pad parts CSL-P, DL-P, and PL-P.

A driving integrated circuit ("IC") for controlling the organic light emitting display panel DP and/or the touch sensing unit TS may be disposed or mounted on the circuit board PCB.

Although not particularly shown, the driving IC may be mounted on the non-display area DD-NDA of FIG. 6E. The driving IC (e.g., input terminals of the driving IC) may be bonded to the touch pad parts SL1-P and SL4-P and the signal pad parts CSL-P, DL-P, and PL-P through the ACF or the solder bump. Here, pads for electrically connecting the driving IC (e.g., output terminals of the driving IC) to the circuit board PCB may be additionally disposed on the non-display area DD-NDA.

Since the pad area of the touch sensing unit TS and the pad area of the display panel DP have laminated structures similar to each other, bonding reliability between the pad area and the circuit board PCB of the display apparatus may be improved. As illustrated in FIGS. 3F, 6B and 6D, the pad area of the touch sensing unit TS may be formed with the laminated structure that is similar to that of the pad area of the organic light emitting display panel DP by using the dummy conductive pads DCP1, DCP2, and DCP3 disposed on the organic light emitting display panel DP. On the pad area of the touch sensing unit TS and the pad area of the organic light emitting display panel DP, the conductive patterns may be commonly disposed on the third insulation layer 16, and another conductive patterns may be disposed under the third insulation layer 16. The conductive patterns disposed on the third insulation layer 16 may be bonded to the pads PCB-P of the circuit board PCB.

Figure 7A:
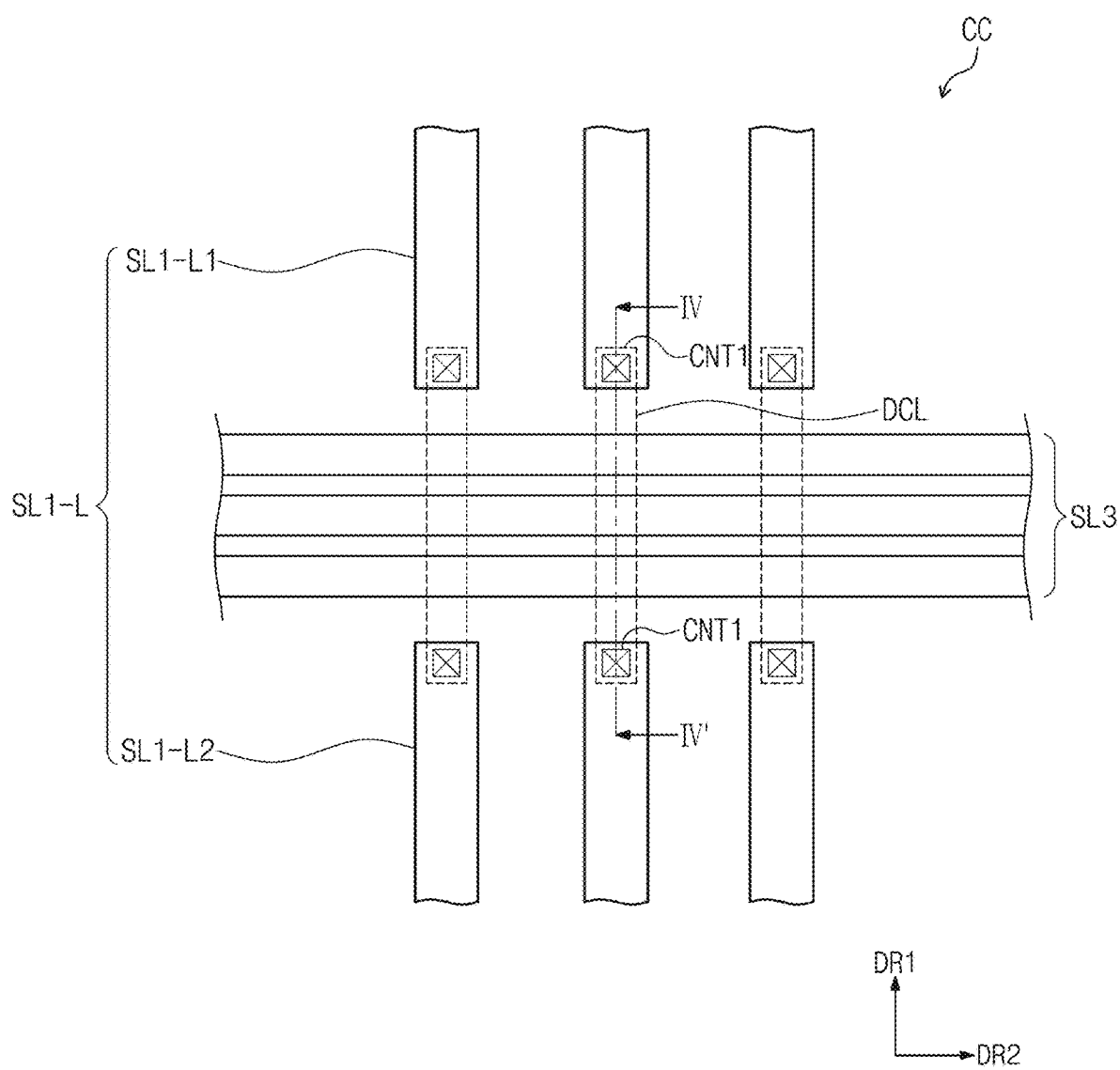
FIG. 7A is a plan view illustrating a pad area of the touch sensing unit according to an embodiment of the inventive concept.
Figure 7B:
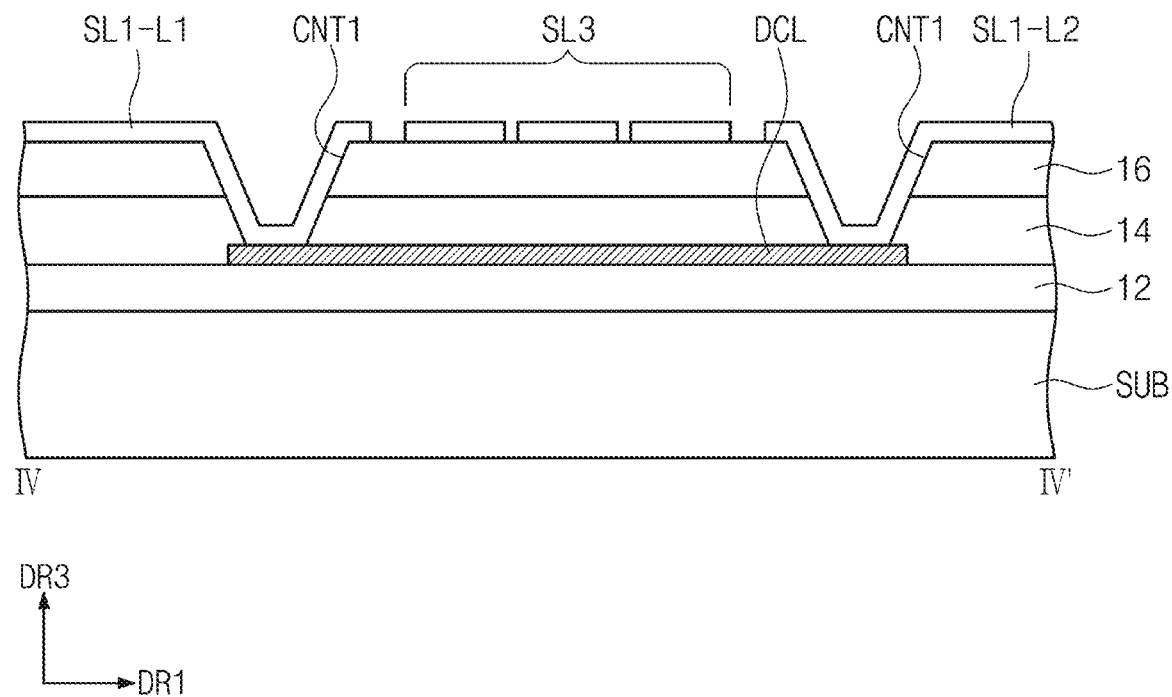
FIG. 7B is a cross-sectional view illustrating the pad area of the touch sensing unit according to an embodiment of the inventive concept.
Figure 7C:
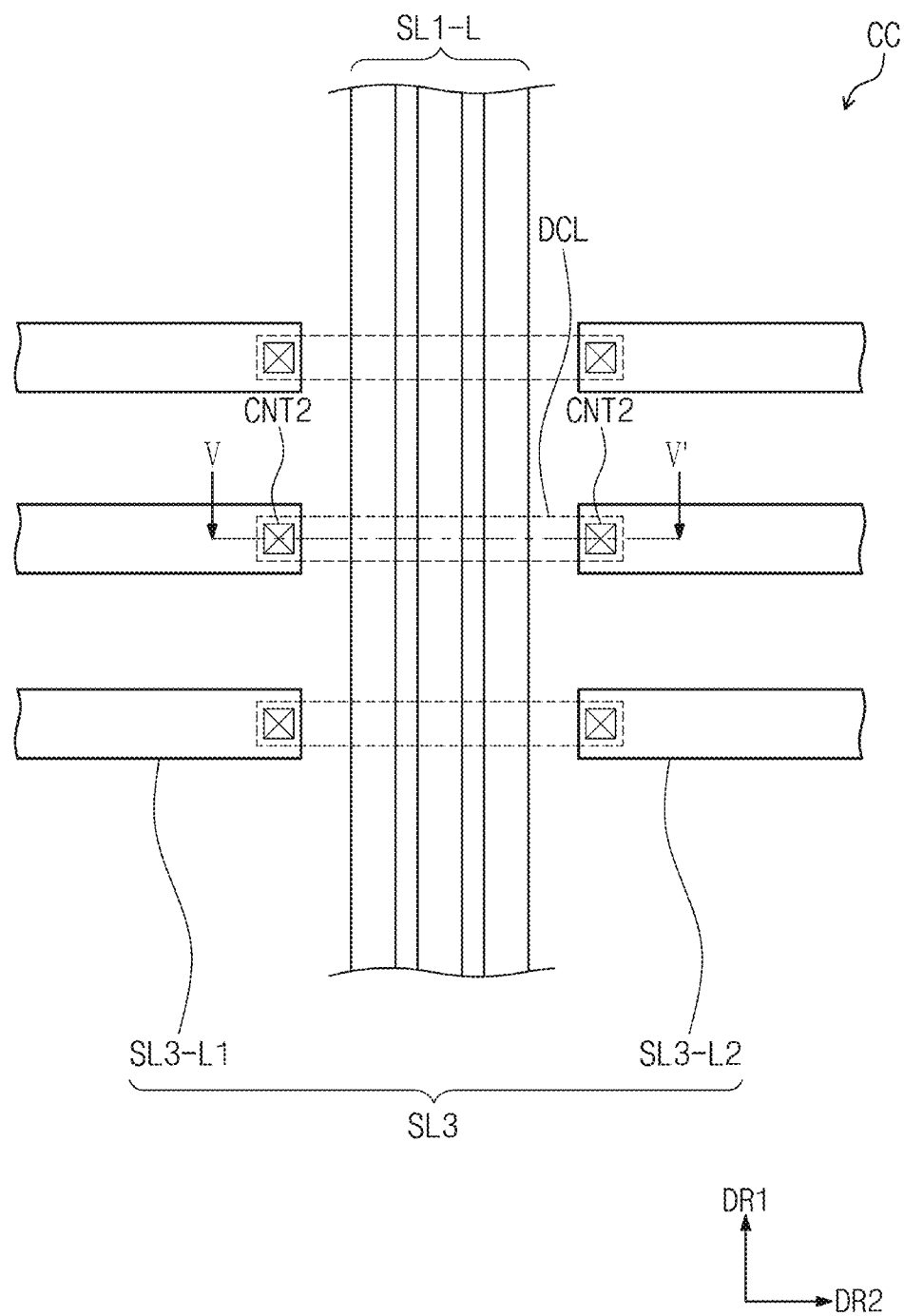
FIG. 7C is a plan view illustrating a pad area of the touch sensing unit according to an embodiment of the inventive concept.
Figure 7D:
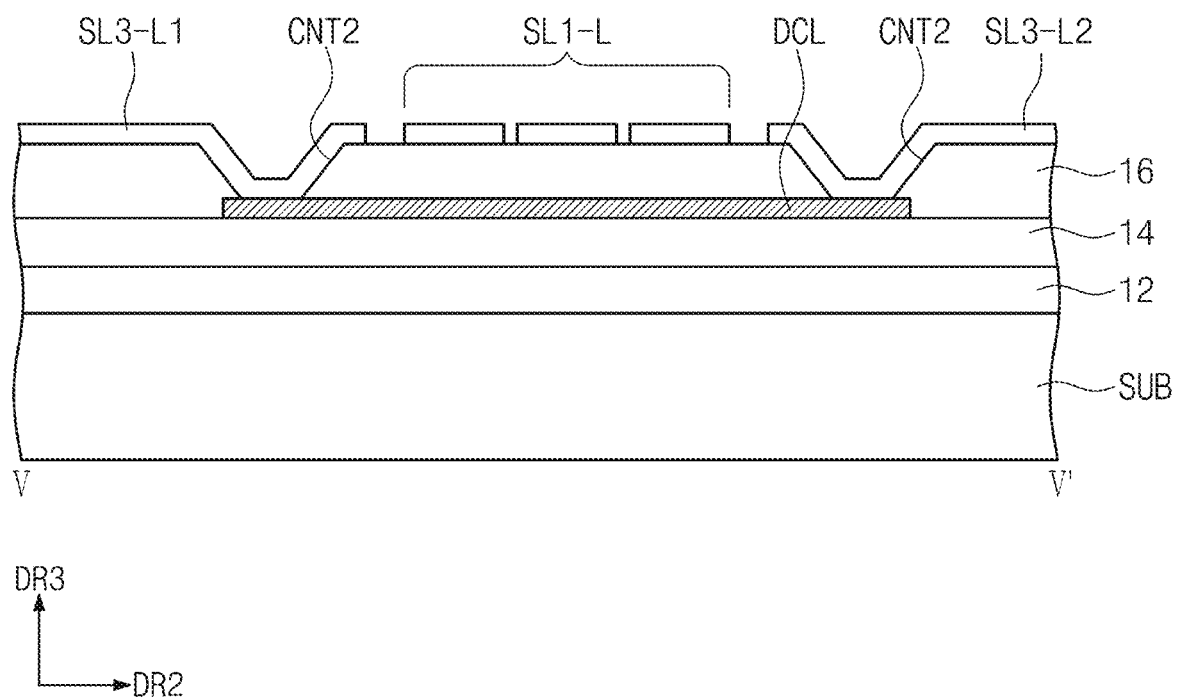
FIG. 7D is a cross-sectional view illustrating the touch pad of the touch sensing unit according to an embodiment of the inventive concept.

FIGS. 7A to 7D are plan and cross-sectional views illustrating a pad area of the touch sensing unit TS according to an embodiment of the inventive concept. FIG. 7A is an enlarged view of an area CC of FIG. 4A in an embodiment, and FIG. 7B is a cross-sectional view taken along line IV-IV' of FIG. 7A. FIG. 7C is an enlarged view of the area CC of FIG. 4A in an alternative embodiment, and FIG. 7D is a cross-sectional view taken along line IV-IV' of FIG. 7C.

The dummy conductive patterns described with reference to FIGS. 3A to 3F may include dummy conductive pads DCL of FIGS. 7A to 7D. The dummy conductive line DCL may be provided in plurality. The dummy conductive lines DCL may be disposed in or directly on the same layer or layers different from each other.

The dummy conductive line DCL may be manufactured through the same photolithography process as that of the first control electrode GE1 (see FIG. 3C) or the same photolithography process as that of the first input electrode SE1 (see FIG. 3C). The dummy conductive line DCL manufactured through the same photolithography process as that of the first control electrode GE1 is illustrated in FIG. 7B, and the dummy conductive line DCL manufactured through the same photolithography process as that of the first input electrode SE1 is illustrated in FIG. 7D.

As illustrated in FIGS. 7A and 7B, a touch line part SL1-L of each of the first touch signal lines SL1 includes a first line part SL1-L1 and a second line part SL1-L2. The first line part SL1-L1 has a first end connected to a corresponding first sensor RP (see FIG. 4A) and a second end connected to the dummy conductive line DCL. The second line part SL1-L2 has a first end connected to the dummy conductive line DCL and a second end connected to the touch pad part SL1-P (see FIG. 4A) of the first touch signal line SL1. The second end of the first line part SL1-L1 and the first end of the second line part SL1-L2 are connected to the dummy conductive line DCL through the first contact holes CNT1 defined through the second insulation layer 14 and the third insulation layer 16. In an embodiment, one of the three dummy conductive lines DCL of FIG. 7A is disposed on the first insulation layer 12, as shown in FIG. 7B. In such an embodiment, at least one of the three dummy conductive lines DCL of FIG. 7A may be disposed on the second insulation layer 14.

In an alternative embodiment, as illustrated in FIGS. 7C and 7D, each of the third touch signal lines SL3 includes a first line part SL3-L1 and a second line part SL3-L2. The first line part SL3-L1 has one end connected to the dummy conductive line DCL through the second contact holes CNT2, and the second line part SL3-L2 has one end connected to the dummy conductive line DCL through the second contact holes CNT2. The first line part SL3-L1 and the second line part SL3-L2 are spaced apart from each other in the row direction (the second direction DR2).

The crossing or bridging portion of the touch signal lines SL1 and SL3 may be realized by using the conductive patterns disposed on the organic light emitting display panel DP. Thus, the single-layered touch sensing unit TS may be formed without performing an additional process for further providing a bridge.

Although FIGS. 7A to 7D show the structures of crossing or bridging portions of touch signal lines in the area CC are shown, such a structure may be applied to other crossing or bridging portion of signal lines in the non-display area NDA. The crossing or bridging portion of the second and third touch signal lines SL2 and SL3 on the area CC of FIG. 4C may be substantially the same as that of the first and third touch signal lines SL1 and SL3 shown in FIGS. 7A to 7D.

Figure 8:
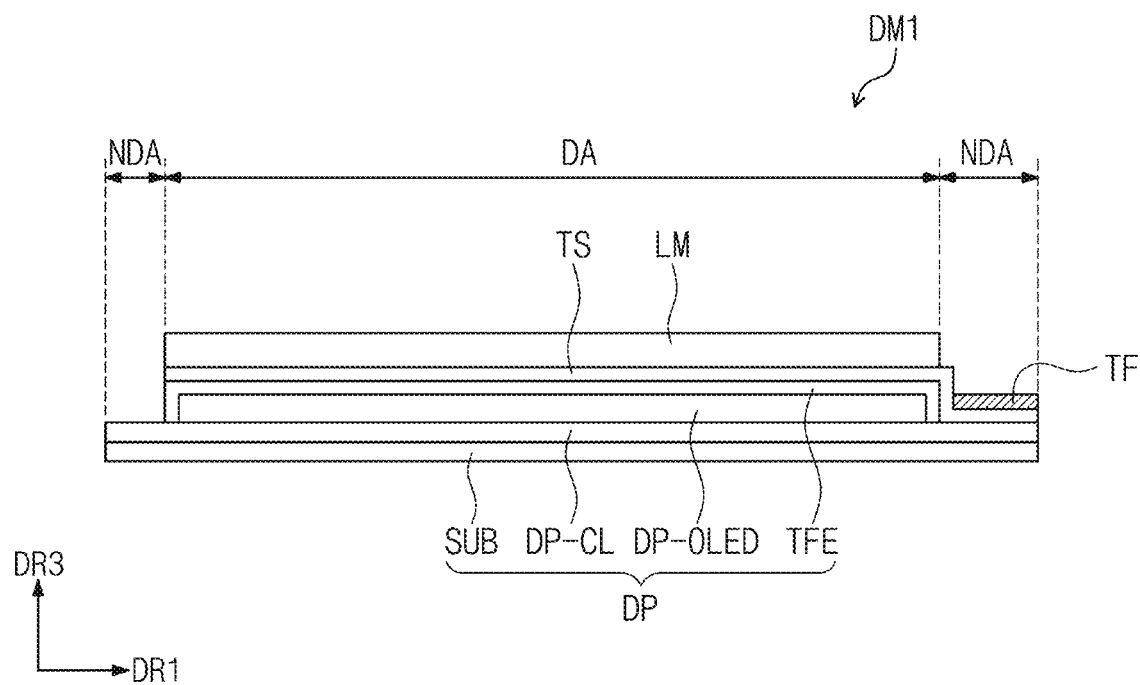
FIG. 8 is a cross-sectional view of a display module according to an embodiment of the inventive concept.

FIG. 8 is a cross-sectional view of a display module DM1 according to an embodiment of the inventive concept. The display module DM1 may further include an optical member LM overlapping the touch sensing unit TS. The optical member LM may include a polarizing film and a phase delay film. The optical member LM may be coupled to the thin film encapsulation layer TFE and the touch sensing unit TS through an adhesion member (not shown). The optical member LM overlaps at least display area DA (see FIG. 3A).

The display module DM1 may further include a resin layer TF that covers portions of the touch signal lines SL1 to SL4 in the non-display area NDA, which may not be covered by the optical member LM, thereby being exposed to outside. The resin layer TF may effectively prevent the portions of the touch signal lines SL1 to SL4 exposed from the optical member LM from being oxidized. The resin layer TF may include or be formed of a sealing material. In an embodiment, the resin layer TF may be formed of a coating material for damp-proof and electrical insulation. In one embodiment, for example, the resin layer TF may include an epoxy-based resin or a silicon-based resin.

In an embodiment, as described above, the display apparatus includes the single-layered touch sensing unit, such that the display apparatus may be relatively simplified when compared to the display apparatus including the multilayered touch sensing unit. In such an embodiment, when the display apparatus is bent, the stress occurring in the touch sensing unit may be effectively reduced due to reduce in thickness of the touch sensing unit having a single-layered structure.

The pad area of the touch sensing unit may have the laminated structure similar to that of the pad area of the organic light emitting display panel by using the dummy conductive patterns disposed in the organic light emitting display panel. Since the pad area of the display apparatus has the uniformly laminated structure, the bonding reliability with respect to the circuit board may be improved.

The crossing or bridging area of the touch signal lines may be realized by using the conductive patterns disposed in the organic light emitting display panel. Thus, the single-layered touch sensing unit may be effectively provided without performing the additional process for further forming the bridge.

It will be apparent to those skilled in the art that various modifications and variations can be made in the inventive concept. Thus, it is intended that the disclosure covers the modifications and variations of this invention provided they come within the scope of the appended claims and their equivalents.

Hence, the real protective scope of the inventive concept shall be determined by the technical scope of the accompanying claims.

What is claimed is:

1. A display apparatus comprising:
an organic light emitting display panel comprising a base layer including a display area and a non-display area adjacent to the display area, a circuit layer disposed on the base layer, a light emitting element layer disposed on the circuit layer and including a light emitting element overlapping the display area, and a thin film encapsulation layer disposed on the light emitting element layer; and
a touch sensing unit disposed on the thin film encapsulation layer and comprising a touch sensor and touch signal lines connected to the touch sensor,
wherein the circuit layer comprises:
first signal lines disposed on the base layer;
a first insulation layer disposed on the first signal lines;
second signal lines disposed on the first insulation layer; and
a dummy conductive pad,
each of the touch signal lines comprises a touch line part and a touch pad part extended from the touch line part, and
the dummy conductive pad is disposed directly on a same layer as the first signal lines or the second signal lines, and overlaps the touch pad part, and
wherein the touch line part overlaps the display area and the touch pad part overlaps the non-display area,
the touch pad part includes an end of a corresponding touch signal line of the touch signal lines,
the dummy conductive pad comprises a first dummy conductive pad, and
the first dummy conductive pad and the first signal lines are disposed under the first insulation layer and the first dummy conductive pad and the first signal lines contact the first insulation layer.

2. The display apparatus of claim 1, wherein the dummy conductive pad further comprises:
a second dummy conductive pad, and
wherein the second dummy conductive pad and the second signal lines are disposed on the first insulation layer and the second dummy conductive pad and the second signal lines contact the first insulation layer.

3. The display apparatus of claim 2, wherein the touch pad part is connected to the first dummy conductive pad through a first contact hole defined through at least the first insulation layer.

4. The display apparatus of claim 2, wherein
the circuit layer further comprises a second insulation layer disposed on the second signal lines, and
the touch pad part is connected to the second dummy conductive pad through a second contact hole defined through the second insulation layer.

5. The display apparatus of claim 2, wherein each of the first dummy conductive pad and the second dummy conductive pad comprises a floating electrode.

6. The display apparatus of claim 1, wherein
each of the second signal lines comprises a signal line part and a signal pad part connected to an end of the signal line part, and the touch sensing unit further comprises a floating electrode disposed directly on a same layer as the touch pad part and connected to the signal pad part.

7. The display apparatus of claim 1, further comprising:
an optical member overlapping the touch sensing unit.

8. The display apparatus of claim 7, further comprising:
a resin layer disposed to cover an exposed portion of each of the touch signal lines through the optical member.

9. The display apparatus of claim 1, wherein the touch sensor and the touch signal lines are disposed directly on the thin film encapsulation layer.

10. The display apparatus of claim 1, wherein
the light emitting element layer comprises emission areas and a non-emission area surrounding the light emission areas, and
a shape of the touch signal lines includes a mesh shape, which overlaps the non-emission area and exposes the emission areas.

\* \* \* \* \*